United States Patent
Yuki et al.

(10) Patent No.: US 9,921,801 B2
(45) Date of Patent: Mar. 20, 2018

(54) CONTROL METHOD AND CONTROL DEVICE

(71) Applicant: Panasonic Intellectual Property Corporation of America, Torrance, CA (US)

(72) Inventors: Yasuhiro Yuki, Kanagawa (JP); Kazuki Funase, Osaka (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 0 days.

(21) Appl. No.: 15/200,002

(22) Filed: Jul. 1, 2016

(65) Prior Publication Data

US 2017/0024184 A1 Jan. 26, 2017

(30) Foreign Application Priority Data

Jul. 21, 2015 (JP) .................................. 2015-144172
May 19, 2016 (JP) .................................. 2016-100328

(51) Int. Cl.

| H03G 3/20 | (2006.01) |
| G06F 3/16 | (2006.01) |
| H03G 3/30 | (2006.01) |
| H04R 27/00 | (2006.01) |
| H03G 3/32 | (2006.01) |
| H03G 3/34 | (2006.01) |
| H04R 1/10 | (2006.01) |

(52) U.S. Cl.
CPC .......... *G06F 3/165* (2013.01); *H03G 3/3005* (2013.01); *H03G 3/32* (2013.01); *H03G 3/342* (2013.01); *H04R 27/00* (2013.01); *H04R 1/1008* (2013.01); *H04R 1/1016* (2013.01); *H04R 2227/003* (2013.01); *H04R 2430/01* (2013.01); *H04R 2460/07* (2013.01); *H04R 2499/11* (2013.01)

(58) Field of Classification Search
CPC ...... G06F 3/165; H03G 3/3005; H04R 1/1008
USPC ........... 455/39, 41.2, 456.2; 340/5.6, 539.13, 340/572.8, 572.4, 572.1; 381/77–82
See application file for complete search history.

(56) References Cited

U.S. PATENT DOCUMENTS

| 2014/0185828 A1* | 7/2014 | Helbling ................ H03G 5/165 381/103 |
| 2015/0256140 A1* | 9/2015 | Smith .................. A61N 1/3993 381/107 |

FOREIGN PATENT DOCUMENTS

JP 2009-180893 8/2009

\* cited by examiner

*Primary Examiner* — Xu Mei
*Assistant Examiner* — Ubachukwu Odunukwe
(74) *Attorney, Agent, or Firm* — Greenblum & Bernstein, P.L.C.

(57) ABSTRACT

Positional information indicative of positions of a plurality of terminals is acquired from the terminals through communication; one or more representative terminals are determined from among the terminals in accordance with a state of distribution of the positions; when the positional information satisfies a predetermined condition, a first command to cause the representative terminals to output a sound at a first sound volume being transmitted to the representative terminals, and a second command to cause general terminals to output a sound at a second sound volume different from the first sound volume being transmitted to the general terminals different from the representative terminals; and when the positional information does not satisfy the predetermined condition, a third command to cause the representative terminals and general terminals to output a sound at a third sound volume being transmitted to the representative terminals and general terminals.

16 Claims, 29 Drawing Sheets

| TERMINAL ID | GROUP ID | INTERGROUP PRIORITY | INTRAGROUP PRIORITY |
|---|---|---|---|
| TERMINAL A | G1 | 1 | G1-1 |
| TERMINAL B | G1 | 1 | G1-2 |
| TERMINAL C | G1 | 1 | G1-3 |
| TERMINAL D | G1 | 1 | G1-4 |
| TERMINAL E | G2 | 2 | G2-2 |
| TERMINAL F | G2 | 2 | G2-1 |
| TERMINAL G | G2 | 2 | G2-3 |
| TERMINAL H | G3 | 3 | G3-2 |

| 621 | 622 | 623 | 624 |
|---|---|---|---|
| LEVEL | RELATIVE DISTANCE | INTRAGROUP CONTROL | INTERGROUP CONTROL |
| L1 | 30 m ≤ | ALL TERMINALS REPRODUCE SOUND | NO ADJUSTMENT BETWEEN GROUPS |
| L2 | 10 m TO 30 m | ALL TERMINALS REPRODUCE SOUND | NO ADJUSTMENT BETWEEN GROUPS |
| L3 | 5 m TO 10 m | ONLY REPRESENTATIVE TERMINAL REPRODUCES SOUND | NO ADJUSTMENT BETWEEN GROUPS |
| L4 | 1 m TO 5 m | ONLY REPRESENTATIVE TERMINAL REPRODUCES SOUND | BOTH GROUPS REPRODUCE SOUND AT LOWER SOUND VOLUME |
| L5 | <1 m | ONLY REPRESENTATIVE TERMINAL REPRODUCES SOUND | NEXT GROUP REPRODUCES SOUND AFTER END OF REPRODUCTION |

| 631 | 632 |
|---|---|
| LEVEL OF DISTANCE FROM REPRESENTATIVE TERMINAL BELONGING TO THE SAME GROUP | SOUND OUTPUT OF GENERAL TERMINAL |
| L1 | OUTPUT |
| L2 | OUTPUT |
| L3 | MUTE |
| L4 | MUTE |
| L5 | MUTE |

| 641 | 642 |
|---|---|
| LEVEL OF DISTANCE FROM SOUND OUTPUT TERMINAL BELONGING TO ANOTHER GROUP | SOUND VOLUME AND SOUND OUTPUT TIMING OF SOUND-OUTPUT-DETERMINED TERMINAL |
| L1 | DEFAULT SOUND VOLUME, DEFAULT TIMING |
| L2 | DEFAULT SOUND VOLUME, DEFAULT TIMING |
| L3 | DEFAULT SOUND VOLUME, DEFAULT TIMING |
| L4 | LOW SOUND VOLUME, DEFAULT TIMING |
| L5 | DEFAULT SOUND VOLUME, DIFFERENT TIMING |

FIG. 10

| | 722 | 723 | 724$_A$ | 725$_A$ | 724$_E$ | 725$_E$ | 724$_H$ | 725$_H$ | |
|---|---|---|---|---|---|---|---|---|---|
| 721 | | | DISTANCE FROM TERMINAL A | LEVEL FROM TERMINAL A | DISTANCE FROM TERMINAL E | LEVEL FROM TERMINAL E | DISTANCE FROM TERMINAL H | LEVEL FROM TERMINAL H | |
| TERMINAL ID | LATITUDE | LONGITUDE | | | | | | | |
| TERMINAL A | αa | βa | — | — | Da–e | L5 | Da–h | L4 | ⋮ |
| TERMINAL B | αb | βb | Db–a | L5 | Db–e | L5 | Db–h | L4 | ⋮ |
| TERMINAL C | αc | βc | Dc–a | L3 | Dc–e | L3 | Dc–h | L2 | ⋮ |
| TERMINAL D | αd | βd | Dd–a | L1 | Dd–e | L1 | Dd–h | L1 | ⋮ |
| TERMINAL E | αe | βe | De–a | L5 | — | — | De–h | L5 | ⋮ |
| TERMINAL F | αf | βf | Df–a | L3 | Df–e | L3 | Df–h | L3 | ⋮ |
| TERMINAL G | αg | βg | Df–a | L2 | Df–e | L2 | Df–h | L2 | ⋮ |
| TERMINAL H | αh | βh | Df–a | L4 | Df–e | L5 | — | — | ⋮ |

| GROUP ID 731 | TERMINAL ID 732 | PRESENCE OR ABSENCE OF SOUND OUTPUT 733 | SOUND VOLUME 734 | TIMING OF SOUND OUTPUT 735 |
|---|---|---|---|---|
| G1 | TERMINAL A | OUTPUT | LOW SOUND VOLUME | DEFAULT TIMING |
| | TERMINAL B | MUTE | — | — |
| | TERMINAL C | MUTE | — | — |
| | TERMINAL D | OUTPUT | NORMAL | DEFAULT TIMING |
| | TERMINAL E | MUTE | — | — |
| G2 | TERMINAL F | MUTE | — | — |
| | TERMINAL G | OUTPUT | NORMAL | DIFFERENT TIMING FROM FIRST GROUP |
| G3 | TERMINAL H | OUTPUT | LOW SOUND VOLUME | SAME TIMING AS FIRST GROUP |

730

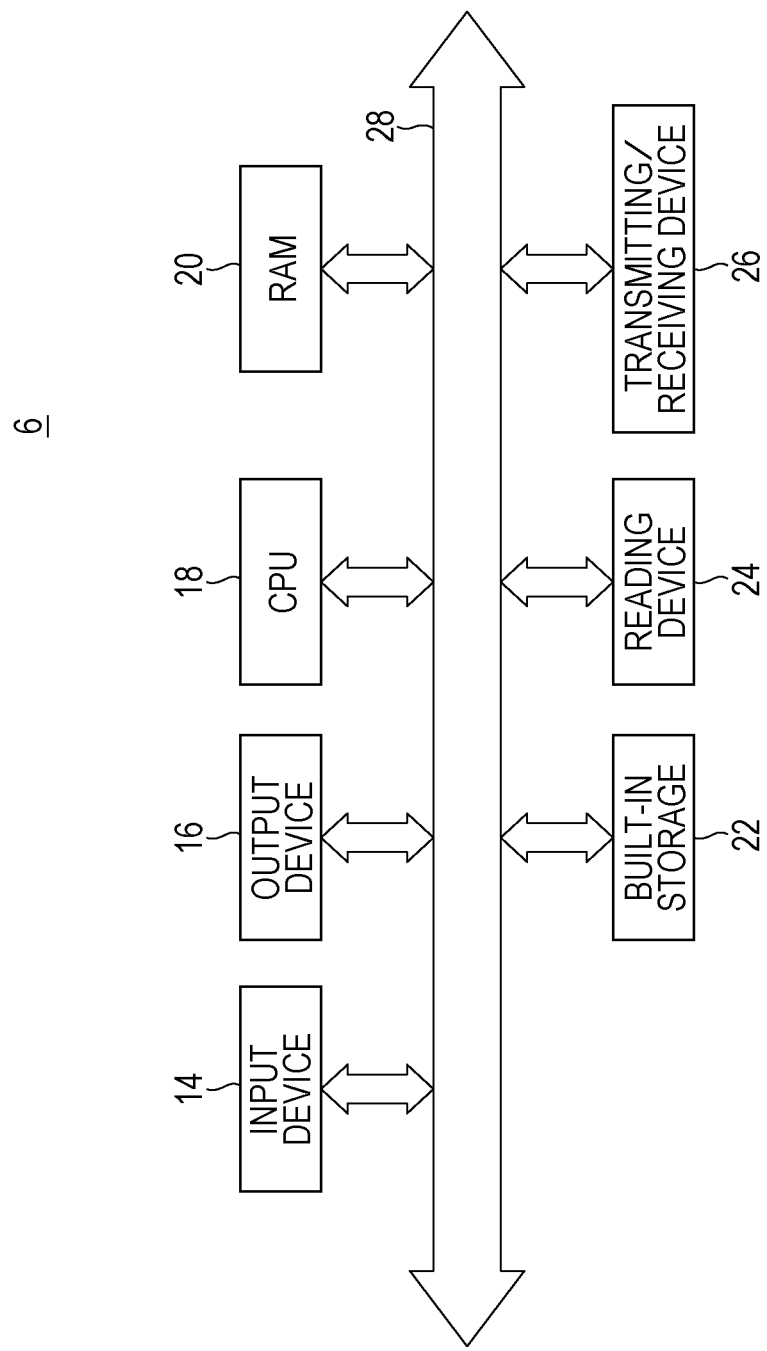

CONTROL METHOD AND CONTROL DEVICE

BACKGROUND

1. Technical Field

The present disclosure relates to a control method and a control device that control output of sounds from a plurality of sound output terminals.

2. Description of the Related Art

A small and portable sound output device (hereinafter referred to as a "sound output terminal") is becoming widespread. A sound output terminal reproduces sound data that is stored in advance or received wirelessly and outputs a beep sound, a sound effect, and the like.

A user can move while carrying the sound output terminal and hear a sound output from the sound output terminal while moving or at a destination. For example, Japanese Unexamined Patent Application Publication No. 2009-180893 describes a technique for controlling output of a sound from a sound output terminal on the basis of the position of the sound output terminal.

According to the technique (hereinafter referred to as "the conventional technique") described in Japanese Unexamined Patent Application Publication No. 2009-180893, a sound including ID (identification information) of an exhibit is output in the vicinity of the exhibit in a museum or the like. Upon acquisition of this sound, the sound output terminal according to the conventional technique extracts the ID and then reproduces content associated with the ID.

Therefore, the conventional technique allows a sound concerning an exhibit to be output from the sound output terminal when a user comes close to the exhibit. Furthermore, the conventional technique allows sound output from a plurality of sound output terminals to be controlled in the same way, i.e., controlled to output a corresponding sound when users come close to an exhibit.

However, the conventional technique has a risk of impairing convenience of a sound output terminal in a case where a plurality of sound output terminals are close to each other. This is because, for example, in a case where a plurality of users come close to the same exhibit, a plurality of sound output terminals output the same sound, which becomes noisy and hard to hear.

SUMMARY

One non-limiting and exemplary embodiment provides a control method and a control device that can maintain convenience of a sound output terminal.

In one general aspect, the techniques disclosed here feature a control method including: acquiring items of positional information indicative of positions of a plurality of terminals, from the plurality of terminals through communication; and determining one or more representative terminals from among the plurality of terminals in accordance with a state of distribution of the positions, when the items of positional information satisfy a predetermined condition, transmitting, to the one or more representative terminals, a first command to cause the one or more representative terminals to output a sound at a first sound volume, and, transmitting to one or more general terminals, a second command to cause one or more general terminals to output a sound at a second sound volume different from the first sound volume, the one or more general terminals are different from the one or more representative terminals, and when the items of positional information do not satisfy the predetermined condition, transmitting to the one or more representative terminals and the one or more general terminals, a third command to cause the one or more representative terminals and the one or more general terminals to output a sound at a third sound volume.

According to the present disclosure, it is possible to maintain convenience of a sound output terminal.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 4 is a diagram illustrating an example of terminal attribute information according to Embodiment 1;

FIG. 5 is a diagram illustrating an example of switching condition information according to Embodiment 1;

FIG. 6 is a diagram illustrating an example of intragroup control information according to Embodiment 1;

FIG. 7 is a diagram illustrating an example of intergroup control information according to Embodiment 1;

FIG. 10 is a diagram illustrating an example of inter-terminal distance information according to Embodiment 1;

FIG. 11 is a diagram illustrating an example of control instruction information according to Embodiment 1;

FIG. 33 is a block diagram illustrating hardware elements of a control device and a sound output terminal according to each of the embodiments.

DETAILED DESCRIPTION

Figure 1:
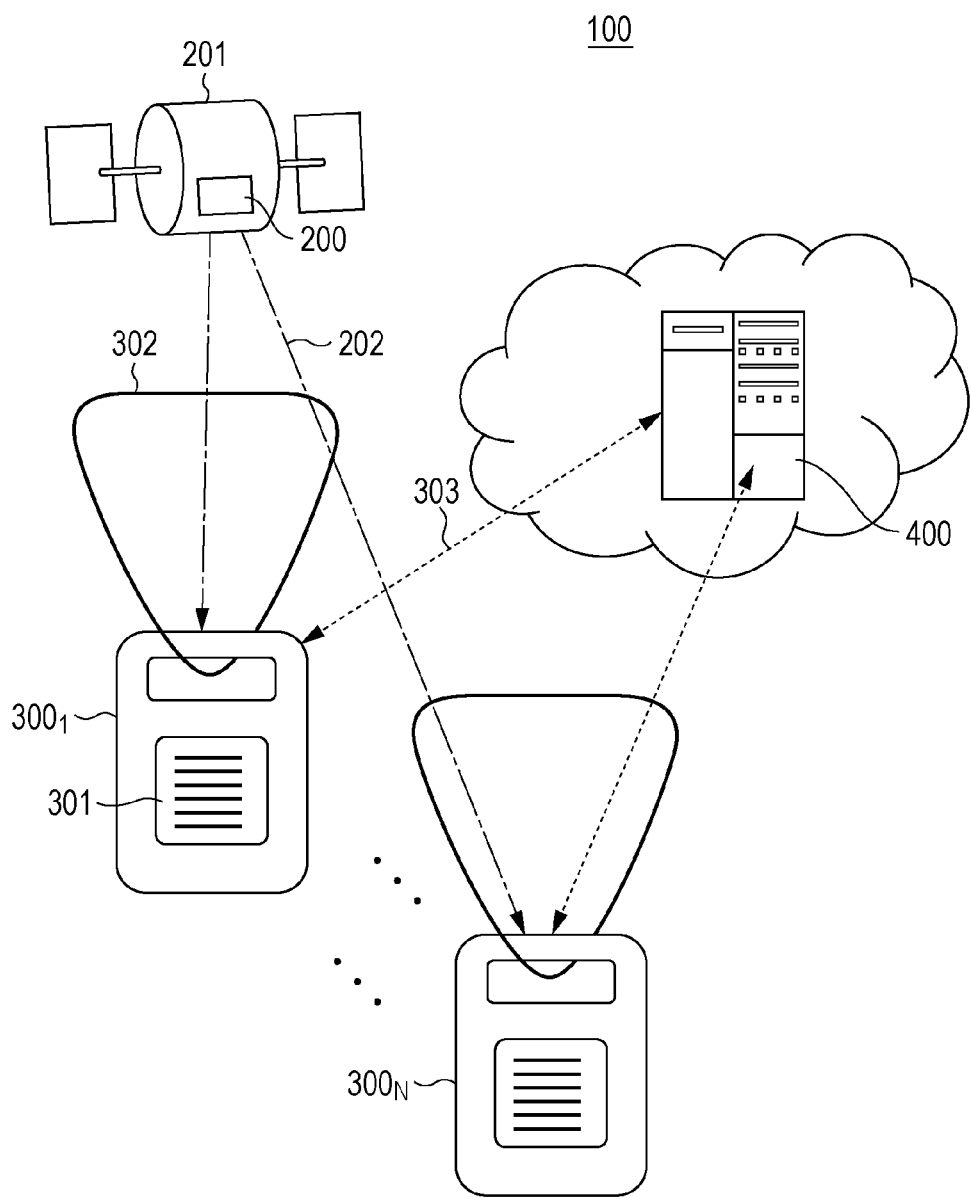
FIG. 1 is a diagram illustrating an example of an outline of a sound output system according to Embodiment 1 of the present disclosure.

Underlying Knowledge Forming Basis of the Present Disclosure

According to the technique described in Japanese Unexamined Patent Application Publication No. 2009-180893, a sound including ID (identification information) of an exhibit is output in the vicinity of the exhibit in a museum or the like. Upon acquisition of this sound, the sound output terminal according to the conventional technique extracts the ID and reproduces content associated with the ID.

Therefore, the aforementioned technique allows a sound concerning an exhibit to be output from the sound output terminal when a user comes close to the exhibit. Furthermore, the aforementioned technique allows sound output from a plurality of sound output terminals to be controlled in the same way, i.e., controlled to output a corresponding sound when users come close to an exhibit.

However, the conventional technique has a risk of impairing convenience of a sound output terminal in a case where a plurality of sound output terminals are close to each other. This is because, for example, in a case where a plurality of users come close to the same exhibit, a plurality of sound output terminals output the same sound, which becomes noisy and hard to hear.

In view of this, the inventor of the present invention considered the following improvements.

(1) A method according to a first aspect of the present disclosure includes acquiring items of positional information indicative of positions of a plurality of terminals from the plurality of terminals through communication; and determining one or more representative terminals from among the plurality of terminals in accordance with a state of distribution of the positions, when the items of positional information satisfy a predetermined condition, transmitting, to the one or more representative terminals, a first command to cause the one or more representative terminals to output a sound at a first sound volume, and, transmitting to one or more general terminals, a second command to cause one or more general terminals to output a sound at a second sound volume different from the first sound volume, the one or more general terminals are different from the one or more representative terminals, and when the items of positional information do not satisfy the predetermined condition, transmitting to the one or more representative terminals and the one or more general terminals, a third command to cause the one or more representative terminals and the one or more general terminals to output a sound at a third sound volume.

(2) In the aspect, the method may be arranged such that the predetermined condition includes a condition that a distance between the one or more representative terminals and the one or more general terminals is equal to or shorter than a predetermined value.

(3) In the aspect, the method may be arranged such that the second sound volume is lower than the first sound volume.

(4) In the aspect, the method may be arranged such that the items of positional information include GPS information.

(5) In the aspect, the method may be arranged such that the one or more representative terminals are determined in advance.

(6) In the aspect, the method may be arranged such that the plurality of terminals are divided into a plurality of groups on basis of the state of distribution of the positions; the plurality of groups include a first group and a second group; the one or more representative terminals include a first representative terminal and a second representative terminal; the one or more general terminals include a first general terminal and a second general terminal; the first representative terminal and the first general terminal belong to the first group; the second representative terminal and the second general terminal belong to the second group; and the first representative terminal is determined so that a distance between the first representative terminal and the second representative terminal is longer than a distance between the first representative terminal and the second general terminal.

(7) In the aspect, the method may be arranged such that the predetermined condition includes a condition that the positions of the plurality of terminals indicated by the items of positional information are within a predetermined region.

(8) A control device according to a second aspect of the present disclosure includes an acquirer that acquires pieces of positional information indicative of positions of a plurality of terminals, from the plurality of terminals; a controller that determines one or more representative terminals from among the plurality of terminals in accordance with a state of distribution of the positions; and a transmitter that transmits, to the one or more representative terminals, a first command to cause the one or more representative terminals to output a sound at a first sound volume and transmits, to one or more general terminals, that are different from the one or more representative terminals, a second command to cause the one or more general terminals to output a sound at a second sound volume different from the first sound volume, when the items of positional information satisfy a predetermined condition, and that transmits, to the one or more representative terminals and the one or more general terminals, a third command to cause the one or more representative terminals and the one or more general terminals to output a sound at a third sound volume, when the items of positional information do not satisfy the predetermined condition.

(9) In the aspect, the control device may be arranged such that the control device is included in each of the plurality of terminals.

(10) In the aspect, the control device may be arranged such that the predetermined condition includes a condition that a distance between the one or more representative terminals and the one or more general terminals is equal to or shorter than a predetermined value.

(11) In the aspect, the control device may be arranged such that the second sound volume is lower than the first sound volume.

(12) In the aspect, the control device may be arranged such that the items of positional information output by the plurality of terminals; and the predetermined condition includes a condition that information sent by a sound output by the one or more representative terminals and information sent by a sound output by the one or more general terminals are identical to each other.

(13) In the aspect, the control device may be arranged such that the items of positional information include sound information comprising sound output by the plurality of terminals; and the predetermined condition includes a condition that sound data output by the one or more representative terminals and sound data output by the one or more general terminals are identical to each other.

(14) In the aspect, the control device may be arranged such that positional information acquired from the one or more representative terminals includes sound volume information output from the one or more general terminals and collected by the one or more representative terminals; and the predetermined condition includes a condition that the sound volume information is equal to or higher than a predetermined threshold value.

(15) In the aspect, the control device may be arranged such that the acquirer acquires the items of positional information from a terminal other than the control device among the plurality of terminals through communication.

(16) In the aspect, the control device may be arranged such that the controller divides the plurality of terminals into a plurality of groups on basis of the state of distribution of the positions; the plurality of groups include a first group and a second group; the one or more representative terminals include a first representative terminal and a second representative terminal; the one or more general terminals include a first general terminal and a second general terminal; the first representative terminal and the first general terminal belong to the first group; the second representative terminal and the second general terminal belong to the second group; and the controller determines the first representative terminal so that a distance between the first representative terminal and the second representative terminal is longer than a distance between the first representative terminal and the second general terminal.

(17) A control device according to a third aspect of the present disclosure is a control device that controls a terminal, including: an acquirer that collects an ambient sound around the control device; a controller that determines an environment in which the terminal is used on basis of the ambient sound; and a transmitter that transmits, to the terminal, a command to output a sound at a sound volume associated with the environment.

(18) In the aspect, the control device may be arranged such that the controller determines whether the environment is indoors or outdoors; the transmitter transmits, to the terminal, a first command to output a sound at a first sound volume when it is determined that the environment is indoors; the transmitter transmits, to the terminal, a second command to output a sound at a second sound volume when it is determined that the environment is outdoors; and the first sound volume is lower than the second sound volume.

(19) In the aspect, the control device may be arranged such that the controller determines whether or not the environment is an environment in which quietness is requested; the transmitter transmits, to the terminal, a first command to output a sound at a first sound volume when it is determined that the environment is an environment in which quietness is requested; the transmitter transmits, to the terminal, a second command to output a sound at a second sound volume when it is not determined that the environment is an environment in which quietness is requested; and the first sound volume is lower than the second sound volume.

(20) In the aspect, the control device may be arranged such that the controller determines whether or not a conversation is being held in an environment in which the terminal is used; the transmitter transmits, to the terminal, a first command to output a sound at a first sound volume when it is determined that the conversation is being held in the environment; the transmitter transmits, to the terminal, a second command to output a sound at a second sound volume when it is determined that the conversation is not being held in the environment; and the first sound volume is lower than the second sound volume.

Embodiments of the present disclosure are described in detail below with reference to the drawings.

Embodiment 1

Embodiment 1 of the present disclosure is an example in which a control device that controls output of sounds from a plurality of sound output terminals is disposed in a server that is provided separately from the plurality of sound output terminals.

Outline of System

First, an outline of a sound output system including a control device according to the present disclosure is described.

Figure 2:
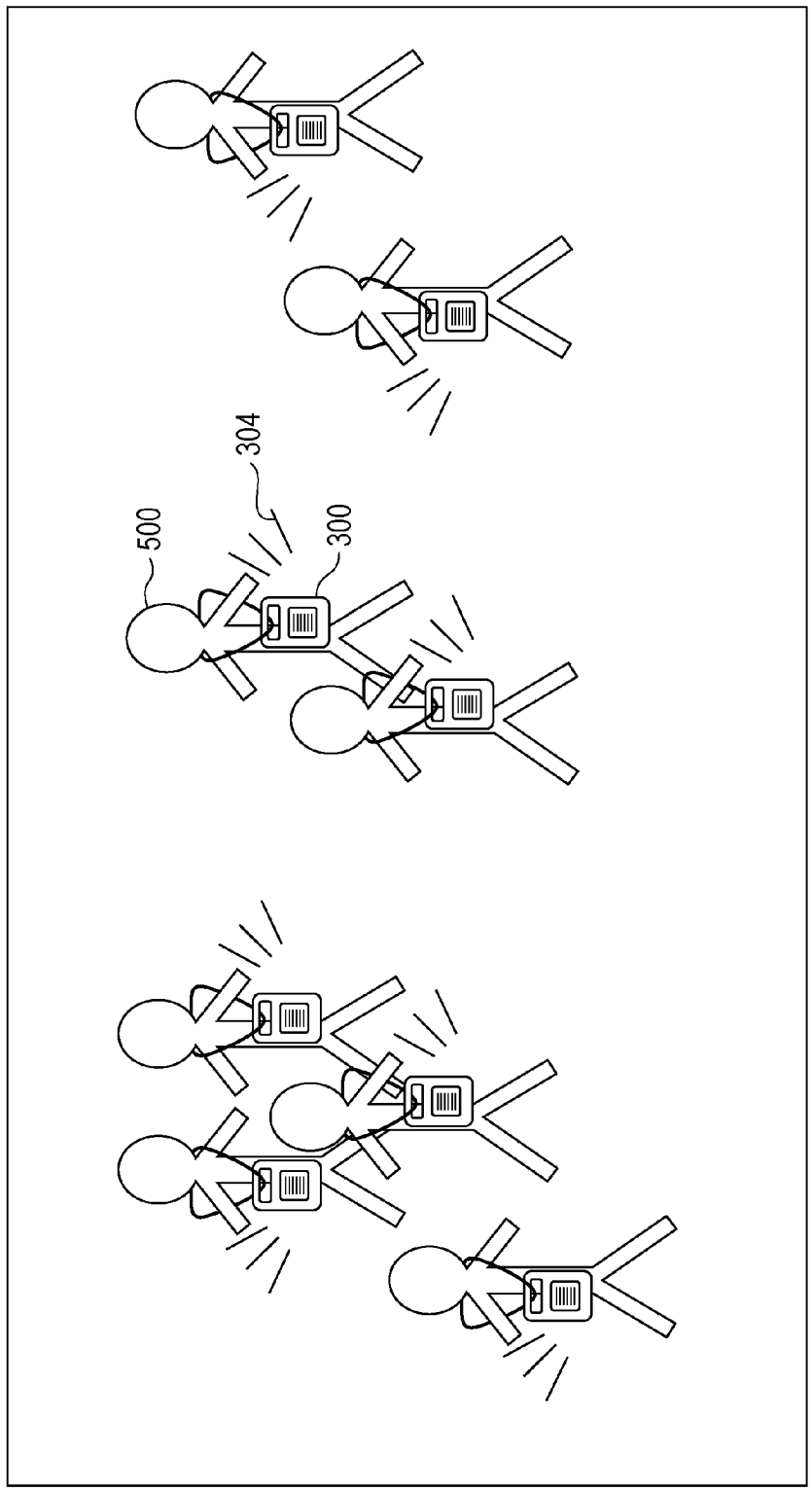
FIG. 2 is a diagram illustrating an example of how a plurality of sound output terminals according to Embodiment 1 are used.

FIG. 1 is a diagram illustrating an example of an outline of the sound output system including a plurality of sound output terminals and a control device. FIG. 2 is a diagram illustrating an example of how the plurality of sound output terminals are used.

As illustrated in FIG. 1, a sound output system 100 includes a positional information providing server 200, first through N-th (N is an integer of 2 or more) sound output terminals $300_1$ through $300_N$, and a control server 400 including a control device according to the present disclosure. Note that the first through N-th sound output terminals $300_1$ through $300_N$ have the same configuration and are therefore collectively described as "sound output terminals 300" as appropriate.

The positional information providing server 200 is, for example, a GPS server that is disposed in a GPS (Global Positioning System) satellite 201 overhead and regularly transmits a GPS signal 202 to the ground. Note that the positional information providing server 200 may be a transmission device in a service that transmits positional (geographical) information as SSID of WiFi (Registered Trademark) or Beacon or may be a server that manages such a transmission device.

Each of the sound output terminals 300 is a small lightweight terminal device that includes a speaker 301 that outputs a sound and a strap 302. As illustrated in FIG. 2, the strap 302 is hung around the neck of a user 500. That is, each of the sound output terminals 300 is carried by the user 500 and outputs a sound 304 from the vicinity of the ears of the user 500.

Note that each of the sound output terminals 300 is not limited to a small special-purpose terminal like the ones illustrated in FIGS. 1 and 2. For example, each of the sound output terminals 300 may be a communication terminal such as a smartphone or may be an attachment device attached to a human body or clothes. Examples of the attachment device include a wristwatch-type terminal (smartwatch), an eyeglass-type terminal (smartglasses), a helmet-type terminal put on the head of a human, and the like.

In the case of a helmet-type terminal, it is desirable that the speaker 301 be located inside the helmet so that a sound can be heard from both right and left ears at an optimum sound volume. This makes it possible to efficiently transmit a sound to both right and left ears, thereby reducing unnecessary emission of a sound to an outside of the helmet. As a terminal for worker's operation in a factory or the like or as an information providing terminal distributed to a participant of a factory tour, the helmet-type terminal is more suitable than a small terminal hung from a neck with a strap because it can be assumed that such a terminal is required to be hands-free so as to allow a user to easily move. In the case of operation in a factory, a scene in which terminals of a plurality of persons output the same information can be assumed, and therefore output control of the sound output terminals 300 described below is effective. The same applies to a terminal used for a factory tour.

Each of the sound output terminals 300 may be mounted in a bicycle, a wheelchair, or the like or may be integral with a bicycle, a wheelchair, or the like. In this case, for example, the whole bicycle can be regarded as the sound output terminal 300. For example, in a scene in which a plurality of persons enjoy a bicycle ride in a group, there are cases where sounds output from the plurality of sound output terminals 300 overlap one another, the output control of the sound output terminals 300 described below is effective. Especially the aforementioned helmet-type or bicycle-mounted-type sound output terminals 300 are suitable because a terminal such as a smartphone cannot be operated on a bicycle.

Each of the sound output terminals 300 receives the GPS signal 202, generates positional information of the sound output terminal 300, and transmits the generated positional information to the control server 400 through wireless communication 303.

The control server 400 controls output of the sound 304 from each of the sound output terminals 300 through the wireless communication 303.

At least some of the first through N-th sound output terminals $300_1$ through $300_N$ output, for example, audio guides of the same contents.

However, in a case where the plurality of sound output terminals 300 are close to one another and all of the sound output terminals 300 output the sound 304, the same sound 304 is output from each of the sound output terminals 300 and is therefore noisy. Furthermore, in a case where the sound output terminals 300 output the sound 304 at different timings, it is difficult to hear the individual sounds 304.

In view of this, the control server 400 determines whether or not the plurality of sound output terminals 300 are close to one another on the basis of positional information received from each of the sound output terminals 300. In a case where the plurality of sound output terminals 300 are close to one another, the control server 400 causes only one of the plurality of sound output terminals 300 to output a sound at a default sound volume or larger and relatively lowers sound volumes of the other sound output terminals 300. That is, the control server 400 switches whether or not sound output of the plurality of sound output terminals 300 is controlled in different ways in accordance with whether or not the acquired positional information satisfies a condition that the plurality of sound output terminals 300 are close to one another.

In a case where the plurality of sound output terminals 300 are away from each other, each of the sound output terminals 300 outputs a sound in a usual way. This allows the users 500 to hear sounds output from the sound output terminals 300 with more certainty.

Meanwhile, in a case where the plurality of sound output terminals 300 are close to one another, it is possible to prevent sounds from being noisy and hard to hear by suppressing sound output of some of the sound output terminals 300. In addition, the users 500 of the sound output terminals 300 whose sound output is suppressed can hear a sound output from the other sound output terminal 300 whose sound output is not suppressed.

That is, the control server 400 maintains convenience of the sound output terminals 300 by switching whether or not sound output of the plurality of sound output terminals 300 is controlled in different ways in accordance with whether or not the aforementioned condition is satisfied.

In the following description, a sound output terminal 300 that outputs a sound at a large sound volume relative to another sound output terminal 300 in a case where the aforementioned different kinds of sound output are performed is referred to as a "representative terminal". Meanwhile, a sound output terminal 300 that outputs a sound at a small sound volume relative to another sound output terminal 300 in a case where the different kinds of sound output control are performed is referred to as a "general terminal".

Note that relatively lowering a sound volume of a general terminal encompass not only lowering an absolute sound volume of the general terminal, but also lowering the sound volume of the general terminal to zero (muting) and turning up an absolute sound volume of a representative terminal.

In the present embodiment, the first through N-th sound output terminals $300_1$ through $300_N$ are classified in advance in groups that output different kinds of sound data (content). These groups are, for example, a group that outputs an audio guide for adults, a group that outputs an audio guide for children, and a group that outputs an audio guide for specialists.

In the following description, as for a certain sound output terminal 300, a group to which this sound output terminal 300 belongs is referred to as an "own group", and a group other than the own group is referred to as "another group".

Configuration of Device

Next, a configuration of each of the sound output terminals 300 and a configuration of the control server 400 are described.

Figure 3:
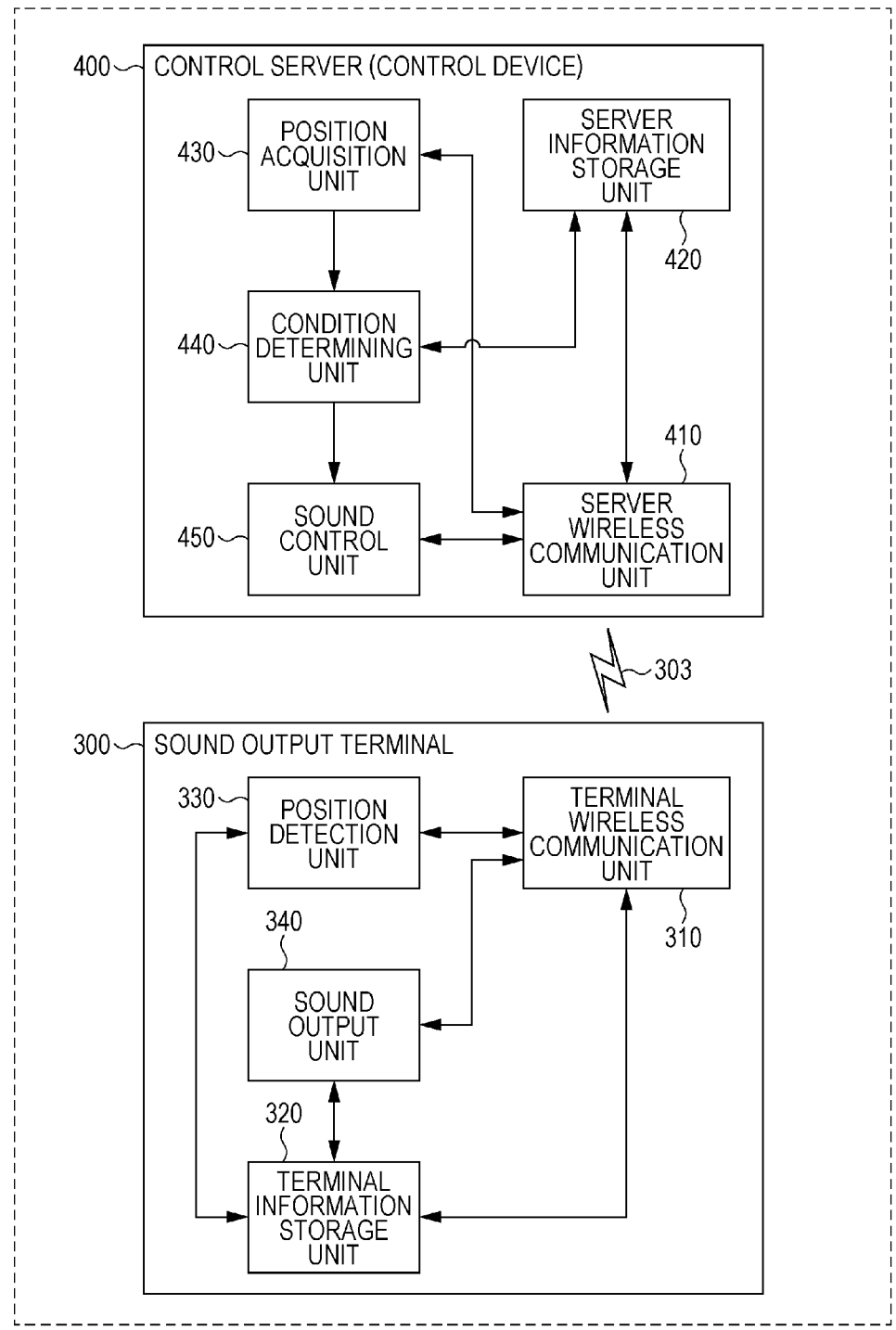
FIG. 3 is a block diagram illustrating an example of a configuration of a sound output terminal and a configuration of a control server according to Embodiment 1.

FIG. 3 is a block diagram illustrating an example of the configuration of each of the sound output terminals 300 and the configuration of the control server 400.

In FIG. 3, the sound output terminal 300 includes a terminal wireless communication unit 310, a terminal information storage unit 320, a position detection unit 330, and a sound output unit 340.

The terminal wireless communication unit 310 is communicably connected to the control server 400 via a wireless access point (not illustrated) through wireless communication 303 using a known wireless communication method with the wireless access point. Note that the terminal wireless communication unit 310 may communicate with the control server 400 via a communication relay device (not illustrated) such as a mobile phone or a wireless communication router.

The terminal information storage unit 320 stores therein various kinds of information such as identification information of the sound output terminal 300 and sound data that is to be output from the sound output terminal 300 (hereinafter referred to simply as "sound data"). For example, the terminal information storage unit 320 acquires the sound data from the control server 400 or another information server via the terminal wireless communication unit 310. The sound data is, for example, sound data of an audio guide described above.

The position detection unit 330 receives the GPS signal 202 (see FIG. 1) and detects a current position of the position detection unit 330 on the basis of the GPS signal 202. The current position is, for example, defined by a combination of latitude and longitude. Then, the position detection unit 330 reads out the identification information of the sound output terminal 300 from the terminal information storage unit 320 and then transmits terminal positional information including the current position and the identification information to the control server 400 via the terminal wireless communication unit 310. The position detection unit 330 transmits the terminal positional information regularly or upon receipt of an instruction from the control server 400.

The sound output unit 340 includes the speaker 301 (see FIG. 1), and reads out the sound data stored in the terminal information storage unit 320 and outputs a sound converted from the sound data.

The sound output unit 340 outputs a sound in accordance with control information concerning sound output upon receipt of the control information from the control server 400 via the terminal wireless communication unit 310. The control information includes, for example, an instruction to change a sound volume from a default sound volume and an instruction to change a sound output timing from a default sound output timing.

Note that the first through N-th sound output terminals $300_1$ through $300_N$ (see FIG. 2) are the same as one another in terms of default sound volume and default sound output timing. Note, however, that the default sound volume may have a width since a favorite sound volume can vary from one user to another. Furthermore, the default sound output timing may be a timing that can vary from one sound output terminal 300 to another such as a timing at which the sound output terminal 300 comes close to an exhibit.

In FIG. 3, the control server 400 includes a server wireless communication unit 410, a server information storage unit 420, a position acquisition unit 430, a condition determining unit 440, and a sound control unit 450.

The server wireless communication unit 410 communicates with the wireless access point by a known communication method and is communicably connected to the sound output terminal 300 via the wireless access point.

The server information storage unit 420 stores therein various kinds of information necessary to determine whether or not sound output of the plurality of sound output terminals 300 is controlled in different ways and to determine specifically in what ways sound output is controlled. The server information storage unit 420 stores therein, for example, terminal attribute information and switching condition information in advance.

The terminal attribute information is information indicative of contents of grouping of the first through N-th sound output terminals $300_1$ through $300_N$ and the priority orders of sound output among the sound output terminals 300 and among the groups.

Hereinafter, the first through N-th sound output terminals $300_1$ through $300_N$ are referred to as terminals A through H as appropriate.

FIG. 4 is a diagram illustrating an example of the terminal attribute information.

As illustrated in FIG. 4, the terminal attribute information 610 describes, for each identification information (hereinafter referred to as a "terminal ID") 611 of each sound output terminal 300, identification information (hereinafter referred to as a "group ID") 612 of its own group. Furthermore, the terminal attribute information 610 describes, for each terminal ID 611, priority (hereinafter referred to as "intergroup priority") 613 of sound output among a plurality of groups and priority (hereinafter referred to as "intragroup priority") 614 of sound output within its own group.

For example, a group ID 612 "G1" is associated with terminal IDs 611 of the terminals A through D. This indicates that the terminals A through D belong to the same group. Furthermore, an intragroup priority 614 "G1-1" is associated with the terminal ID 611 of the terminal A. This indicates that the terminal A is a representative terminal in the group "G1" or that priority of determination as a representative terminal is highest. Furthermore, an intergroup priority 613 "1" is associated with the group ID 612 "G1". This indicates that the group "G1" has the highest priority in terms of sound output.

Note that the terminal attribute information 610 may describe identification information of sound data to be output from each sound output terminal 300. In a case where the terminals A through H are classified into groups on the basis of types of sound data, the terminal attribute information 610 may describe, for each group, identification information of sound data.

The switching condition information is information indicating a condition on which it is determined that sound output of the plurality of sound output terminals 300 is controlled in different ways. Note that the switching condition information is information that indicates the condition in association with whether or not the plurality of sound output terminals 300 are close to each other, i.e., a relative positional relationship among the plurality of sound output terminals 300.

FIG. 5 is a diagram illustrating an example of the switching condition information.

As illustrated in FIG. 5, the switching condition information 620 defines, for each level 621 of a distance between sound output terminals 300, a relative distance 622, intragroup control 623, and intergroup control 624.

The relative distance 622 is a relative distance between two sound output terminals 300. The intragroup control 623 defines, for each relative distance 622, the presence of sound output of a general terminal (all terminals reproduce s sound) or the absence of sound output of a general terminal (only a representative terminal reproduces a sound). Note that the relative distance 622 in this case is a relative distance between a general terminal and a representative terminal in the same group. The intergroup control 624 defines, for each relative distance 622, that each sound output terminal 300 that outputs a sound outputs a sound in a normal way (no adjustment between groups), each sound output terminal 300 that outputs a sound lowers a sound volume (both groups reproduce a sound at lower sound volume), or each sound output terminal 300 that outputs a sound outputs a sound at a timing different from another group (a next group reproduces a sound after the end of reproduction). Note that the relative distance 622 in this case is a relative distance from a sound output terminal 300 belonging to another group that outputs a sound.

Note that the switching condition information 620 may be divided into intragroup control information that defines a condition concerning control based on an intragroup distance and intergroup control information that defines a condition concerning control based on an intergroup distance.

FIG. 6 is a diagram illustrating an example of the intragroup control information.

As illustrated in FIG. 6, intragroup control information 630 defines, for each level 631 of a distance between a general terminal and a representative terminal in the same group, sound output 632 of the general terminal.

For example, sound output 632 "output" is associated with levels "L1" and "L2", i.e., a relative distance of 10 m or longer. This means that a general terminal that is away by 10 m or longer from a representative terminal belonging to the same group outputs a sound. This is because a sound output from a representative terminal is hard to reach a general terminal located far from the representative terminal.

Furthermore, for example, sound output 632 "mute" is associated with levels "L3" through "L5", i.e., a relative distance of less than 10 m. This means that a general terminal that is away by less than 10 m from a representative terminal belonging to the same group outputs no sound. This is because a sound output from a representative terminal is easy to reach a general terminal located close to the representative terminal.

Hereinafter, a sound output terminal 300 that has been determined not to be muted (i.e., determined to output a sound) is referred to as a "sound-output-determined terminal" as appropriate.

FIG. 7 is a diagram illustrating an example of the intergroup control information.

As illustrated in FIG. 7, the intergroup control information 640 defines, for each level 641 of a distance from a sound-output-determined terminal belonging to another group, a sound volume and a sound output timing 642 of a sound output terminal.

For example, a sound volume and a sound output timing 642 "default sound volume, default timing" are associated with the levels "L1" through "L3", i.e., a relative distance of 5 m or longer. This means that a sound-output-determined terminal that is away by 5 m or longer from all sound-output-determined terminals belonging to another group keeps a default sound volume and a default sound output timing. This is because in a case of a combination of sound output terminals 300 that output different sounds, an output sound of one sound output terminal 300 is hard to reach the other sound output terminal 300 or is easy to hear even if the output sound reaches the other sound output terminal 300 as long as the sound output terminals 300 are away by 5 m or longer from each other.

Furthermore, for example, a sound volume and a sound output timing 642 "small sound volume, default timing" are associated with the level "L4", i.e., a relative distance of 1 m or longer and less than 5 m. This means that a sound-output-determined terminal that is away by 1 m or longer and less than 5 m from the closest sound-output-determined terminal among all sound-output-determined terminals belonging to another group lowers a sound volume and keeps a default sound output timing. This is because in a case of a combination of sound output terminals 300 that output different sounds at the distance of 1 m or longer and less than 5 m, an output sound of one sound output terminal 300 is easy to reach the other sound output terminal 300 but can be distinguished from an output sound of the other sound output terminal 300 as long as sound volumes are lowered.

Furthermore, for example, a sound volume and a sound output timing 642 "default sound volume, different timing" are associated with the level "L5", i.e., a relative distance of less than 1 m. This means that a sound-output-determined terminal that is away by less than 1 m from the closest sound-output-determined terminal among all sound-output-determined terminals belonging to another group keeps a default sound volume and shifts a sound output timing from that of the other group that is away by less than 1 m. This is because it is hard to hear sounds in a case where a plurality of different sounds are output at the same timing at the distance of less than 1 m.

Note that the "different timing" means that a group with higher intergroup priority 613 (see FIG. 4) outputs a sound at an earlier timing. Furthermore, in a case where a plurality of sound output terminals 300 belonging to the same group have the same sound output timing, the "different timing" means that a sound output timing is shifted on a group basis.

The position acquisition unit 430 in FIG. 3 acquires terminal positional information from each sound output terminal 300 via the server wireless communication unit 410. Note that the position acquisition unit 430 may acquire the terminal positional information by instructing each sound output terminal 300 to transmit the terminal positional information or may acquire the terminal positional information by receiving the terminal positional information that is regularly transmitted from each sound output terminal 300.

N pieces of terminal positional information that are acquired from the first through N-th sound output terminals $300_1$ through $300_N$ indicate a relative positional relationship among the first through N-th sound output terminals $300_1$ through $300_N$ as a whole. That is, the position acquisition unit 430 acquires positional information indicative of the relative positional relationship among the first through N-th sound output terminals $300_1$ through $300_N$. The position acquisition unit 430 supplies the acquired positional information to the condition determining unit 440.

The condition determining unit 440 determines whether or not the condition that the plurality of sound output terminals 300 are close to each other is satisfied on the basis of the positional information supplied from the position acquisition unit 430. In a case where this condition is satisfied, the condition determining unit 440 determines that sound output of a representative terminal and sound output of a general terminal are controlled in different ways.

More specifically, the condition determining unit 440 refers to the terminal attribute information 610 (see FIG. 4), and the switching condition information 620 (see FIG. 5) or the intragroup control information 630 (see FIG. 6) and the intergroup control information 640 (see FIG. 7). Then, the condition determining unit 440 determines, for each sound output terminal 300, whether or not the condition on which no sound is output is satisfied, and further determines whether or not the condition on which a sound output timing is shifted from another group is satisfied.

In the case of the intragroup control information 630 and the intergroup control information 640, a condition on which each sound output terminal 300 outputs no sound is that a distance from a representative terminal belonging to the same group is less than 10 m. Furthermore, a condition on which each sound output terminal 300 outputs a sound at a low sound volume is that a distance from the closest sound output terminal 300 belonging to another group is 1 m or longer and less than 5 m. Furthermore, a condition on which each sound output terminal 300 outputs a sound at a shifted sound output timing is that a distance from the closest sound output terminal 300 belonging to another group is less than 1 m.

The condition determining unit 440 determines, for each sound output terminal 300, whether or not to output a sound, whether or not to lower a sound volume, and whether or not to shift a sound output timing in accordance with whether or not these conditions are satisfied. Then, the condition determining unit 440 supplies, to the sound control unit 450, control instruction information indicative of a result of determination concerning sound output control of each sound output terminal 300.

The sound control unit 450 controls sound output of each sound output terminal 300 in accordance with the control instruction information supplied from the condition determining unit 440. More specifically, the sound control unit 450 generates control information giving, for example, an instruction to lower a sound volume of an output sound so that the result of determination indicated by the control instruction information is realized, and then transmits the control information to each sound output terminal 300 via the server wireless communication unit 410.

Note that such control includes giving no instruction to a sound output terminal 300 that has been determined to output a sound at a default sound volume at a default sound output timing (i.e., causing the sound output terminal 300 to continue a default operation). As for a group in which a plurality of sound output terminals 300 are close to each other, such control includes controlling sound output of a representative terminal and sound output of a general terminal in different ways, for example, causing only the representative terminal to output a sound while prohibiting the general terminal from outputting a sound.

That is, the sound control unit 450 controls output of sounds from a plurality of sound output terminals 300 by switching whether or not sound output of a representative terminal and sound output of a general terminal are controlled in different ways in accordance with whether or not the condition that the plurality of sound output terminals 300 are close to each other is satisfied.

The sound output terminal 300 and the control server 400 each include, for example, a CPU (Central Processing Unit), a storage medium such as a ROM (Read Only Memory) in which a control program is stored, a working memory such as a RAM (Random Access Memory), and a communication circuit, each of which is not illustrated. In this case, functions of the aforementioned units are realized by CPU's execution of the control program.

The sound output terminal 300 having the above configuration can transmit terminal positional information indicative of a current position of the sound output terminal 300 to the control server 400. Furthermore, the sound output terminal 300 can, for example, stop sound output, lower a sound volume, and adjusts a sound output timing in accordance with control of the control server 400 while outputting a sound in a state where the sound output terminal 300 is carried by the user 500.

The control server 400 having the above configuration can control sound output of each sound output terminal 300 on the basis of a relative positional relationship among a plurality of sound output terminals 300. In particular, the control server 400 can control output of sounds from a plurality of sound output terminals 300 by switching whether or not sound output of a representative terminal and sound output of a general terminal are controlled in different ways in accordance with whether or not the plurality of sound output terminals 300 are close to each other.

Operation of Device

Next, an operation of the control server 400 is described.

Figure 8:
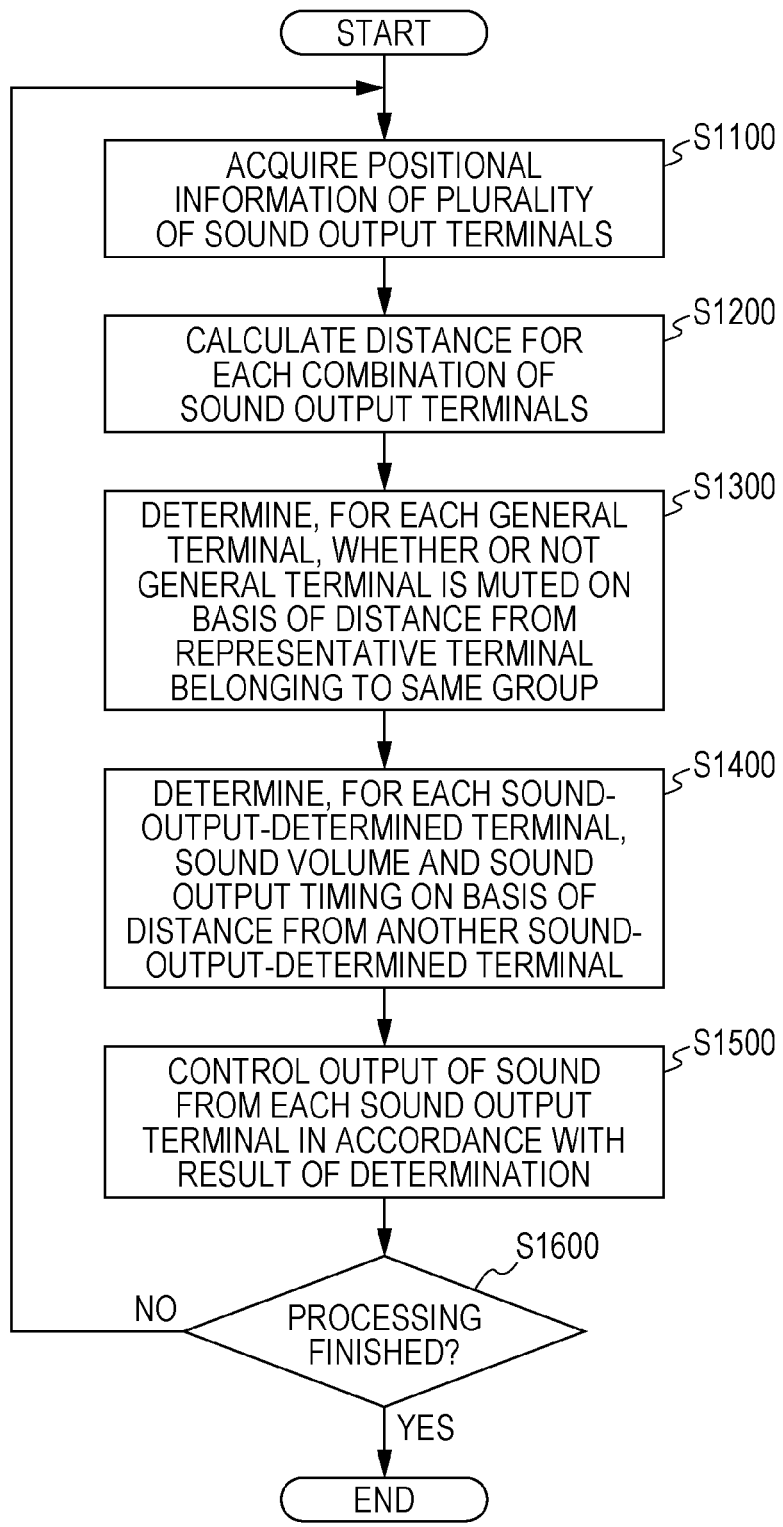
FIG. 8 is a flow chart illustrating an example of an operation of a control server according to Embodiment 1.

FIG. 8 is a flow chart illustrating an example of the operation of the control server 400.

In Step S1100, the position acquisition unit 430 acquires positional information indicative of a relative positional relationship among a plurality of sound output terminals 300 by collecting terminal positional information from each of the terminals A through H.

Figure 9:
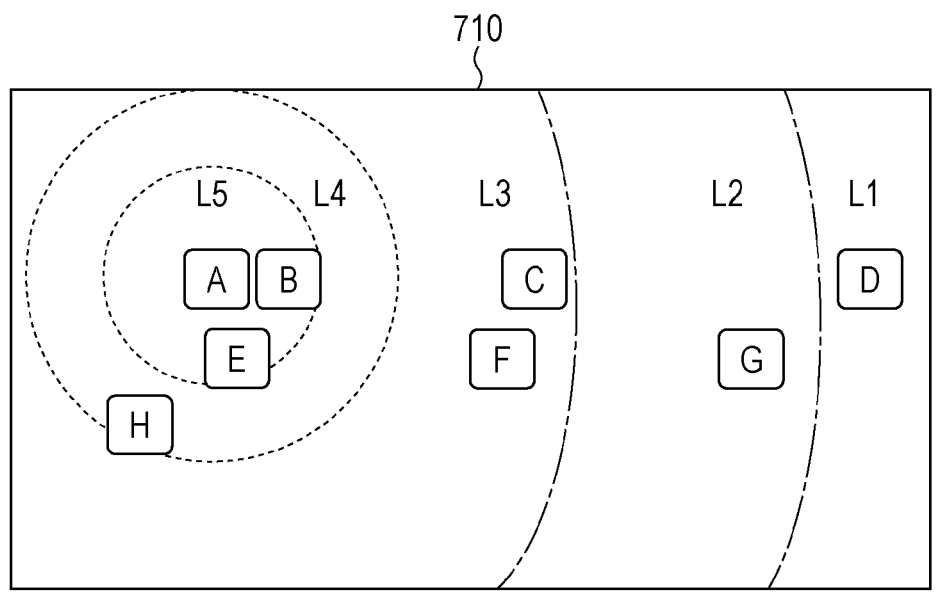
FIG. 9 is a diagram illustrating an example of contents of positional information according to Embodiment 1.

FIG. 9 is a diagram illustrating an example of contents of the positional information acquired by the position acquisition unit 430. In FIG. 9, the positions of the sound output terminals 300 in plan view are plotted. Furthermore, FIG. 9 illustrates, for reference, regions of levels L1 through L5 of a distance from the terminal A.

As illustrated in a plot diagram 710 of FIG. 9, for example, the terminals A, B, and E are located close to one another, the terminal H is located a little distance away, and the terminals C and E are located further away. The terminals D and G are located extremely away. In such a relative positional relationship, if both of the terminals A and B that belong to the same group output sounds, the sounds become noisy, and if the terminals A, E, and H that belong to different groups output sounds in default settings, it becomes hard to hear the output sounds.

In Step S1200 of FIG. 8, the condition determining unit 440 calculates a distance for each combination of sound output terminals 300 on the basis of the positional information. Then, the condition determining unit 440 generates and holds inter-terminal distance information describing a result of the calculation.

FIG. 10 is a diagram illustrating an example of the inter-terminal distance information.

As illustrated in FIG. 10, inter-terminal distance information 720 describes, for each terminal ID 721, a latitude 722 and a longitude 723, which are terminal positional information, and distances 724 and levels 725 from respective sound output terminals 300.

For example, a distance $724_A$ from the terminal A "Db-a" and a level $725_A$ from the terminal A "L5" are described in associated with a terminal ID 721 "terminal B". This indicates that a distance between the terminal A and the terminal B is Db-a, and the level of the distance is L5.

In Step S1300 of FIG. 8, the condition determining unit 440 determines, for each general terminal, whether or not the general terminal is muted on the basis of a distance from a representative terminal belonging to the same group. The condition determining unit 440 performs this determining process on the basis of the terminal attribute information 610 (see FIG. 4), and the switching condition information 620

(see FIG. 5) or the intragroup control information 630 (see FIG. 6), and the inter-terminal distance information 720 (see FIG. 10).

In Step S1400, the condition determining unit 440 determines, for each sound-output-determined terminal that has been determined not to be muted, a sound volume and a sound output timing on the basis of a distance from another sound-output-determined terminal. The condition determining unit 440 performs this determining process on the basis of the terminal attribute information 610 (see FIG. 4), the switching condition information 620 (see FIG. 5) or the intergroup control information 640 (see FIG. 7), and the inter-terminal distance information 720 (see FIG. 10). Then, the condition determining unit 440 supplies control instruction information indicative of all of the results of the determining process.

FIG. 11 is a diagram illustrating an example of the control instruction information.

As illustrated in FIG. 11, the control instruction information 730 defines, for each terminal ID 732 associated with the group ID 731, presence or absence of sound output 733, a sound volume 734, and a timing of sound output 735.

For example, presence or absence of sound output 733 "output", a sound volume 734 "low sound volume", and a timing of sound output 735 "default timing" are associated with a terminal ID 732 "terminal A". This indicates that it has been determined that the terminal A outputs a sound at a low sound volume at a default sound output timing.

A reason why it has been determined that the terminal A outputs a sound is that the terminal A is a representative terminal having the highest intragroup priority 614 (see FIG. 4). A reason why the sound volume of the terminal A is low is that the terminal H belonging to another group exists close to the terminal A. A reason why it has been determined that the sound output timing of the terminal A is a default one is that the intergroup priority 613 (see FIG. 4) of the group to which the terminal A belongs is highest. Note that the condition determining unit 440 may determine that a sound is output at a larger sound volume as the intergroup priority 613 becomes higher on the basis of the intergroup priority 613.

In Step S1500 of FIG. 8, the sound control unit 450 controls sound output from each sound output terminal 300 in accordance with the results of the determining process indicated by the control instruction information. For example, the sound control unit 450 generates control information giving an instruction to lower a sound volume of sound output and then transmits the control information to the terminal A.

Then, in Step S1600, the position acquisition unit 430 determines whether or not an instruction to finish the processing for controlling sound output of the sound output terminal 300 has been given by an operator's operation. In a case where the instruction to finish the processing has not been given (NO in S1600), the position acquisition unit 430 returns to Step S1100. Meanwhile, in a case where the instruction to finish the processing has been given (YES in S1600), the position acquisition unit 430 finishes the series of processing.

Through the aforementioned operation, the control server 400 can perform, for each sound output terminal 300, a sound output controlling process including stoppage of sound output, lowering of a sound volume, and adjustment of a sound output timing on the basis of the relative positional relationship among the plurality of sound output terminals 300.

Flow of Information Among Devices

A flow of information among the devices of the sound output system 100 is briefly described below.

Figure 12:
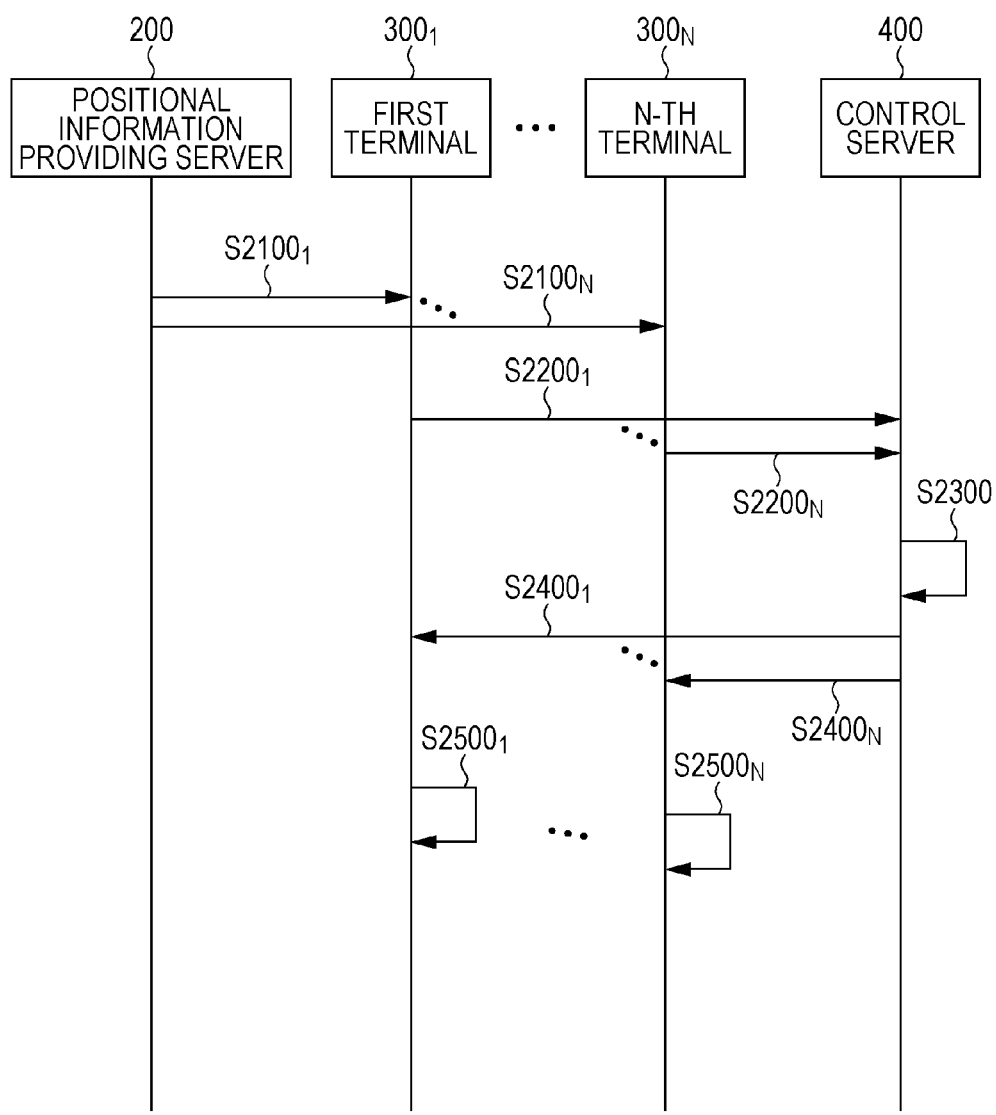
FIG. 12 is a sequence diagram illustrating an example of flow of information among devices according to Embodiment 1.

FIG. 12 is a sequence diagram illustrating an example of the flow of information among the devices of the sound output system 100.

As illustrated in FIG. 12, first, each of the first through N-th sound output terminals $300_1$ through $300_N$ receives a GPS signal from the positional information providing server 200 ($S2100_1$ through $S2100_N$) and then transmits terminal positional information obtained from the GPS signal to the control server 400 ($S2200_1$ through $S2200_N$).

Then, the control server 400 determines contents of control of sound output of each sound output terminal 300 (S2300) and generates control information and transmits the control information to each sound output terminal 300 (for example, each of the first through N-th sound output terminals $300_1$ through $300_N$) ($S2400_1$ through $S2400_N$), as described with reference to FIG. 8.

Then, each sound output terminal 300 (for example, each of the first through N-th sound output terminals $300_1$ through $300_N$) outputs a sound in accordance with the received control information ($S2500_1$ through $S2500_N$).

Note that the control server 400 need not necessarily transmit the control information to a sound output terminal 300 that has been determined to operate at a default sound volume at a default sound output timing. In this case, the sound output terminal 300 that does not receive the control information continues to operate at a default sound volume at a default sound output timing.

Effects of Present Embodiment

As described above, according to the present embodiment, the control server 400 acquires positional information of each of a plurality of sound output terminals 300 through communication. Then, the control server 400 controls sound output from the plurality of sound output terminals 300 by switching whether or not sound output of a representative terminal and sound output of a general terminal among the plurality of sound output terminals 300 are controlled in different ways in accordance with whether or not a predetermined condition concerning the acquired positional information is satisfied. Specifically, in a case where the plurality of sound output terminals 300 are close to one another, the control server 400 causes only the representative terminal to output a sound and makes a sound volume of the general terminal relatively low.

This allows the control server 400 to prevent sounds from being output from the plurality of sound output terminals 300 that are close to one another and prevent the sounds from becoming noisy and hard to hear, thereby making it possible to maintain convenience of the sound output terminals 300.

Note that it is possible that a transmission method (e.g., earphones or headphones) that allows only persons who are carrying terminals to hear a sound be adopted as a method for providing sounds that are easy to hear in a case where a plurality of users are close to one another. However, the following advantages can be obtained in a case where terminals, such as the sound output terminals 300, that emit sounds to an outside are adopted instead of the terminals, such as earphones or headphones, that do not emit sounds to an outside.

In recent years, human-body-attachment type wearable terminals such as smartwatches and smartglasses are becoming widespread, and it can be assumed that such wearable terminals are used in various scenes. For example, even in exhibition in a museum or the like, it is also possible to provide information by using a wearable terminal which each person owns instead of distributing special-purpose earphone-type terminals inserted into ears. Wearable terminals often include a speaker (emission-type speaker) that emits a sound to an outside but do not include an output terminal for earphones or headphones. Therefore, by adopting the sound output terminals 300, it is possible to cope with a scene where information is presented to each person by using emission-type speakers mounted in the wearable terminals.

Furthermore, in recent years, from the perspective of safety and the like, it is recommended that external sounds be not blocked by earphones or headphones attached to ears during moving on foot or on a bicycle or during working. Therefore, by adopting the sound output terminals 300, it is possible to cope with a scene where sound information is provided during moving or working.

That is, by adopting the sound output terminals 300 that emit sounds to surroundings by using emission-type speakers and the control server 400 that controls output of the sounds, it is possible to present optimum information to owners of the sound output terminals by outputting sounds as needed while achieving harmony with the surroundings.

Modification of Present Embodiment

Note that the position detection unit 330 of each sound output terminal 300 may acquire terminal positional information on the basis of information other than a GPS signal.

For example, in a case where the terminal wireless communication unit 310 communicates with a wireless base station, the position detection unit 330 may acquire, as terminal positional information, identification information of the wireless base station from communication control information concerning communication with the wireless base station.

In a case where the terminal wireless communication unit 310 communicates with another sound output terminal 300, the position detection unit 330 may acquire, as terminal positional information, a received signal intensity of the communication or an estimated distance from the other sound output terminal 300 calculated from the received signal intensity. In this case, positional information acquired by the position acquisition unit 430 of the control server 400 is information that indicates not the position of each sound output terminal 300 but distances among the plurality of sound output terminals 300.

The condition determining unit 440 of the control server 400 may dynamically determine a representative terminal in accordance with a distribution of the plurality of sound output terminals 300 or the like.

Figure 13:
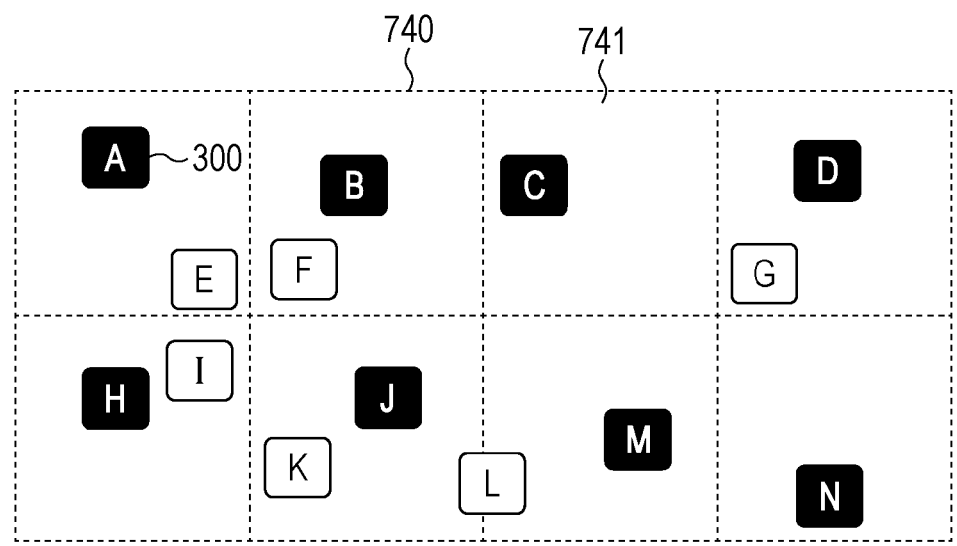
FIG. 13 is a diagram for explaining a first example of a case where a representative terminal is dynamically determined according to Embodiment 1.

FIG. 13 is a diagram for explaining an example of a case where a representative terminal is dynamically determined.

As illustrated in FIG. 13, the plurality of sound output terminals 300, i.e., the terminals A through N are located in a certain target region 740. The terminals A through N are sound output terminals 300 that output the same sound.

The condition determining unit 440 of the control server 400 sets, for example, divided regions 741 obtained by dividing the target region 740. A maximum distance within each divided region 741 is shorter than a distance over which an output sound reaches. Then, the condition determining unit 440 determines, for each divided region 741, a sound output terminal 300 that is closest to a center of the divided region 741 as a representative terminal on the basis of positional information.

In this case, for example, the terminals A through D, H, J, M, and N are determined as representative terminals. As a result, for example, a user of the terminal E hears an output sound from the terminal A.

Figure 14:
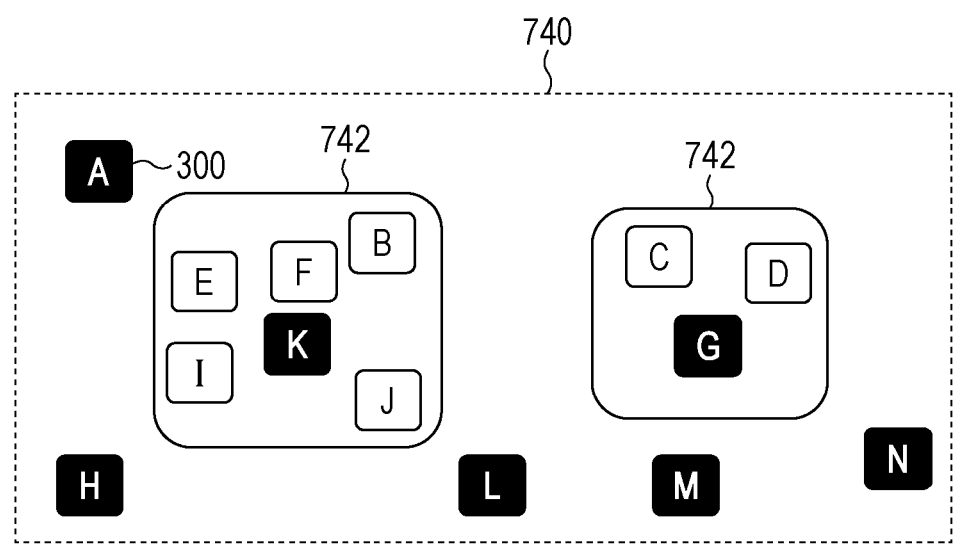
FIG. 14 is a diagram for explaining a second example of a case where a representative terminal is dynamically determined according to Embodiment 1.

FIG. 14 is a diagram for explaining another example of a case where a representative terminal is dynamically determined and corresponds to FIG. 13.

As illustrated in FIG. 14, first, the condition determining unit 440 determines a crowded region 742 crowded with a plurality of sound output terminals 300 on the basis of positional information. A condition for the crowded region 742 is, for example, that within a distance over which an output sound from a certain sound output terminal 300 reaches, two or more other sound output terminals 300 are present.

Then, the condition determining unit 440 determines, for each crowded region 742, a sound output terminal 300 closest to a center of the crowded region 742 and a sound output terminal 300 located out of the crowded region 742 as representative terminals and determines remaining sound output terminals 300 as general terminals.

In this case, for example, the terminals A, G, H, K, and L through N are determined as representative terminals. As a result, for example, a user of the terminal E hears an output sound from the terminal K.

By thus dynamically determining a representative terminal, the sound output system 100 can cope with a case where a representative terminal is not determined in advance.

Note that a method for dynamically determining a representative terminal is not limited to these examples. For example, in a case where a plurality of sound output terminals 300 belong to a certain group, the condition determining unit 440 may set, as a representative terminal, one of the plurality of sound output terminals 300 that is farthest from a representative terminal of another group.

Embodiment 2

Embodiment 2 of the present disclosure is an example of a case where the same sound data is output for each relatively narrow region such as a communication area of wireless LAN.

Outline of System

First, an outline of a sound output system including a control device according to the present embodiment is described.

Figure 15:
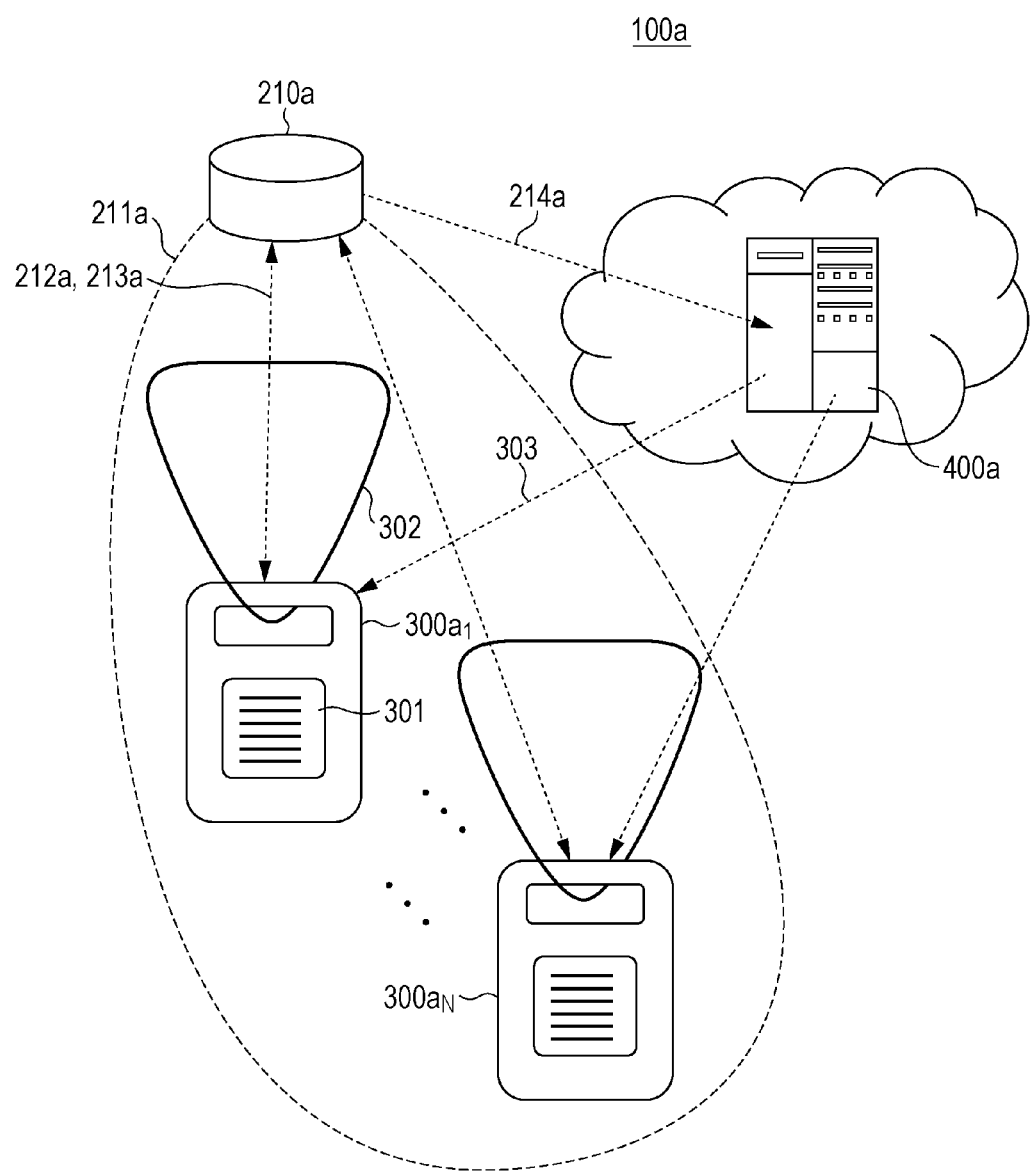
FIG. 15 is a diagram illustrating an example of an outline of a sound output system according to Embodiment 2 of the present disclosure.

FIG. 15 is a diagram illustrating an example of the outline of the sound output system according to the present embodiment and corresponds to FIG. 1 of Embodiment 1. Parts that are identical to those in FIG. 1 are given identical reference signs, and description thereof is omitted.

As illustrated in FIG. 15, a sound output system 100a includes a wireless base station 210a, first through N-th sound output terminals $300a_1$ through $300a_N$, and a control server 400a including a control device according to the present disclosure. Note that the first through N-th sound output terminals $300a_1$ through $300a_N$ have the same configuration and are therefore collectively described as "sound output terminals 300a" as appropriate.

The wireless base station 210a periodically transmits a beacon 212a to a surrounding communication area 211a and waits for a response signal 213a that is returned from a sound output terminal 300a located in the communication area 211a in response to the beacon 212a. Upon receipt of the response signal 213a, the wireless base station 210a transmits, as contained-terminal information, a terminal ID of the sound output terminal 300a included in the response signal 213a and a base station ID which is identification information of the wireless base station 210a to the control server 400a through communication 214a.

Note that the communication area 211a is an area throughout which a sound output from a single sound output terminal 300a reaches at a sufficient sound volume. For example, in a case where the sound volume of the sound output terminals 300a is equivalent to that of the sound output terminals 300 in Embodiment 1, the communication area 211a is a circular region having a diameter of approximately 10 m.

Upon receipt of the beacon 212a from the wireless base station 210a, each sound output terminal 300a transmits the response signal 213a including the terminal ID of the sound output terminal 300a.

The control server 400a determines contents of sound output control on each sound output terminal 300a on the basis of the contained-terminal information received from the wireless base station 210a, and then controls output of a sound from each sound output terminal 300a through wireless communication 303 in accordance with a result of the determination.

The contained-terminal information of the wireless base station 210a is information indicating which sound output terminal 300a is located in the communication area 211a of the wireless base station 210a. That is, in a case where a plurality of sound output terminals 300a are present in the communication area 211a, the contained-terminal information is positional information indicating that the plurality of sound output terminals 300a are located in the communication area 211a and indicating a relative positional relationship among the plurality of sound output terminals 300a.

In the present embodiment, the same sound data is output from one or a plurality of sound output terminals 300a located in the communication area 211a. Since sound output terminals 300a that constitute the same group are not specified, a representative terminal of the group is dynamically determined.

In the present embodiment, sound output of another group close to the group is not considered.

Configuration of Device

Next, a configuration of each sound output terminal 300a and a configuration of the control server 400a are described.

Figure 16:
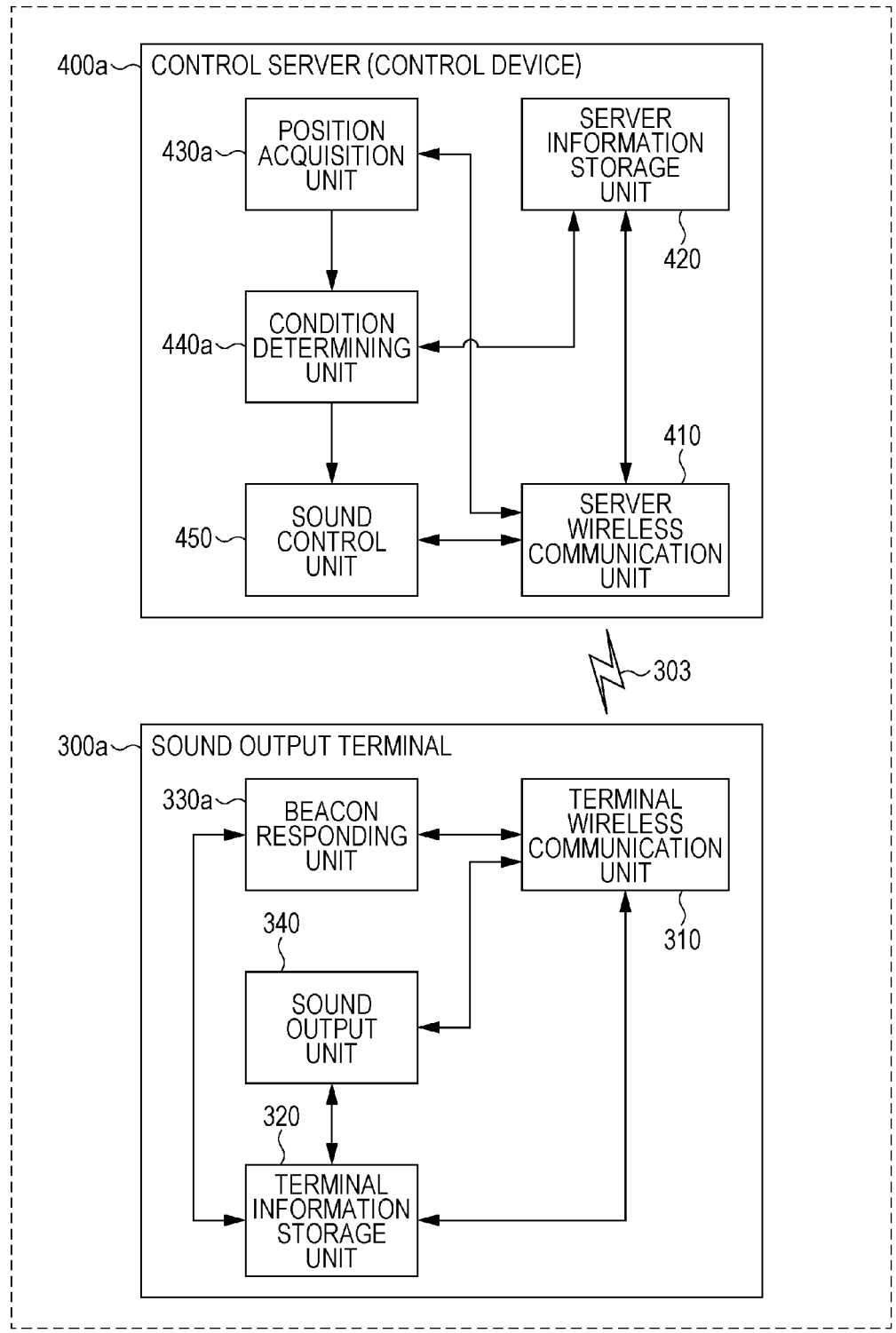
FIG. 16 is a block diagram illustrating an example of a configuration of a sound output terminal and a configuration of a control server according to Embodiment 2.

FIG. 16 is a block diagram illustrating an example of a configuration of each sound output terminal 300a and a configuration of the control server 400a and corresponds to FIG. 3 of Embodiment 1. Parts that are identical to those in FIG. 3 are given identical reference signs, and description thereof is omitted.

As illustrated in FIG. 16, each sound output terminal 300a includes a beacon responding unit 331a instead of the position detection unit 330 of FIG. 3.

The beacon responding unit 331a receives the beacon 212a transmitted from the wireless base station 210a via a terminal wireless communication unit 310 in a case where the sound output terminal 300a is located in the communication area 211a. Then, upon receipt of the beacon 212a, the beacon responding unit 331a reads out identification information of the sound output terminal 300a from a terminal information storage unit 320 and then transmits a response signal 213a including the identification information to the wireless base station 210a via the terminal wireless communication unit 310.

Through transmission of such a response signal, contained-terminal information indicating that the sound output terminal 300a is located in the communication area 211a is transmitted from the wireless base station 210a to the control server 400a, as described with reference to FIG. 15.

As illustrated in FIG. 16, the control server 400a includes a position acquisition unit 430a and a condition determining unit 440a instead of the position acquisition unit 430 and the condition determining unit 440 of FIG. 3.

The position acquisition unit 430a receives contained-terminal information transmitted from the wireless base station 210a via a server wireless communication unit 410. The contained-terminal information indicating that the first through N-th sound output terminals $300a_1$ through $300a_N$ are located in the communication area 211a is positional information indicative of a relative positional relationship among the first through N-th sound output terminals $300a_1$ through $300a_N$ gathered in the communication area 211a which is a narrow region. The position acquisition unit 430a supplies the acquired positional information to the condition determining unit 440a.

The condition determining unit 440a determines whether or not a condition that the number of sound output terminals 300 located in the communication area 211a is equal to or larger than a predetermined value (an integer of 2 or more) is satisfied on the basis of the positional information supplied from the position acquisition unit 430a. In a case where the condition is satisfied, the condition determining unit 440a determines a representative terminal from among the plurality of sound output terminals located in the communication area 211a and determines that sound output of the representative terminal and sound output of a general terminal are controlled in different ways.

More specifically, the condition determining unit 440a determines that sound output control for making a sound volume of the general terminal low relative to a sound volume of the representative terminal is performed. Then, the condition determining unit 440a supplies control instruction information indicative of contents of the determined sound output control to a sound control unit 450.

Note that the server information storage unit 420 of the control server 400a need not necessarily store therein the terminal attribute information 610 (see FIG. 4), the switching condition information 620 (see FIG. 5), the intragroup control information 630 (see FIG. 6), the intergroup control information 640 (see FIG. 7), and the like described in Embodiment 1.

Hardware configurations of the sound output terminal 300a and the control server 400a can be, for example, similar to those of the sound output terminal 300 and the control server 400 of Embodiment 1. Note, however, that hardware suitable for the communication described in FIG. 15 is employed as communication circuits of the sound output terminal 300a and the control server 400a.

The sound output terminal 300a having the above configuration can notify the control server 400a that the sound output terminal 300a is located in the communication area 211a of the wireless base station 210a via the wireless base station 210a.

The control server 400a having the above configuration can specify a sound output terminal 300a located in the communication area 211a of the wireless base station 210a via the wireless base station 210a. Furthermore, the control server 400a can control output of sounds from a plurality of sound output terminals 300a by switching whether or not sound output of a representative terminal and sound output of a general terminal are controlled in different ways in accordance with the number of sound output terminals 300a located in the communication area 211a.

Operation of Device

Next, an operation of the control server 400a is described.

Figure 17:
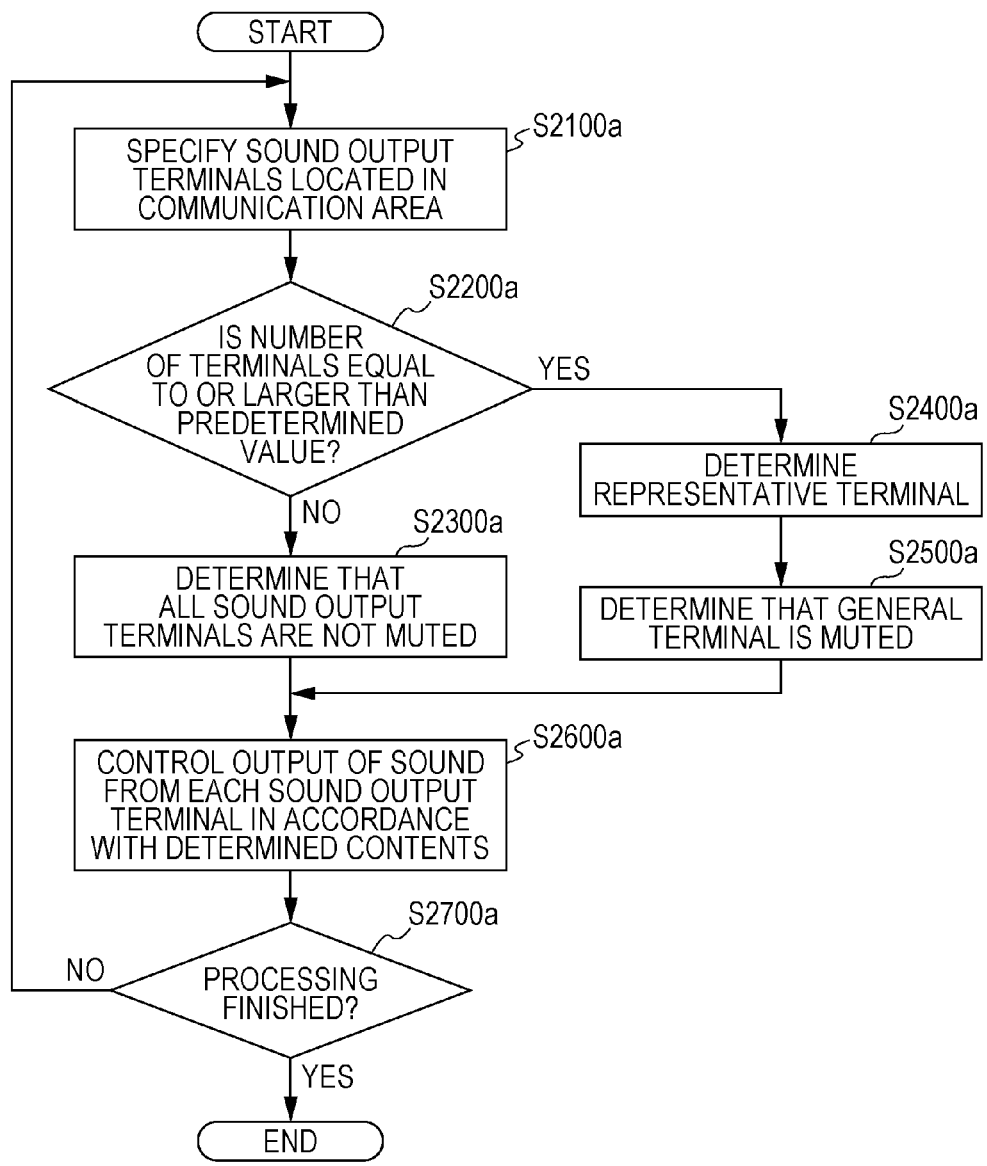
FIG. 17 is a flow chart illustrating an example of an operation of a control server according to Embodiment 2.

FIG. 17 is a flow chart illustrating an example of the operation of the control server 400a.

In Step S2100a, the position acquisition unit 430a specifies a sound output terminal 300a located in the communication area 211a of the wireless base station 210a on the basis of acquired contained-terminal information of the wireless base station 210a. The sound output terminal 300a located in the communication area 211a is, for example, the first through N-th sound output terminals $300a_1$ through $300a_N$.

In Step S2200a, the condition determining unit 440a determines whether or not the number of sound output terminals 300a (hereinafter referred to as "the number of terminals") located in the communication area 211a is equal to or larger than a predetermined value.

Note that the predetermined value that is a threshold value of the number of terminals may be a value that is preset or stored in the condition determining unit 440a or the server information storage unit 420 or may be a value set by an operator or a value that changes in accordance with an environment. In a case where a plurality of communication areas 211a are present, the predetermined value may vary from one communication area 211a to another.

In a case where the number of terminals is less than the predetermined value (NO in S2200a), the condition determining unit 440a proceeds to Step S2300a. Meanwhile, in a case where the number of terminals is equal to or larger than the predetermined value (YES in S2200a), the condition determining unit 440a proceeds to Step S2400a.

In Step S2300a, the condition determining unit 440a determines that all of the sound output terminals 300a located in the communication area 211a are not muted. That is, the condition determining unit 440a determines that all of the sound output terminals 300a keep default settings without distinction between a representative terminal and a general terminal.

Meanwhile, in Step S2400a, the condition determining unit 440a determines a representative terminal from among the plurality of sound output terminals 300a located in the communication area 211a. The number of representative terminals may be one or may be more than one. For example, the condition determining unit 440a determines, as a representative terminal, a sound output terminal 300a that has entered the communication area 211a first or a sound output terminal 300a that has entered the communication area 211a last.

In Step S2500a, the condition determining unit 440a determines that a general terminal among the plurality of sound output terminals 300a located in the communication area 211a is muted. That is, the condition determining unit 440a determines that the representative terminal keeps default settings and that the general terminal outputs no sound.

In Step S2600a, the sound control unit 450 controls output of a sound from each sound output terminal 300a in accordance with the contents determined by the condition determining unit 440a.

Then, in Step S2700a, the position acquisition unit 430a determines whether or not an instruction to finish the processing has been given. In a case where the instruction to finish the processing has not been given (NO in S2700a), the position acquisition unit 430a returns to Step S2100a. Meanwhile, in a case where the instruction to finish the processing has been given (YES in S2700a), the position acquisition unit 430a finishes the series of processing.

Through the aforementioned operation, the control server 400a can switch whether or not sound output of a representative terminal and sound output of a general terminal are controlled in different ways in accordance with whether or not the condition that the number of terminals in the communication area 211a is equal to or larger than the predetermined value is satisfied.

Effects of Present Embodiment

As described above, according to the present embodiment, the control server 400a determines whether or not the condition that a plurality of sound output terminals 300a whose number is equal to or larger than the predetermined value are located in the communication area 211a that is a relatively narrow region is satisfied on the basis of acquired positional information. In a case where this condition is satisfied, the control server 400a determines a representative terminal and causes only the representative terminal to output a sound while muting a general terminal.

This allows the control server 400a to prevent sounds from being output from a large number of sound output terminals 300a in a relatively narrow region and prevent the sounds from becoming noisy and hard to hear, thereby maintaining convenience of the sound output terminals 300a.

Modification of Present Embodiment

Note that a region where the same sound data is output may be made up of a plurality of communication areas 211a of a plurality of wireless base stations 210a. In a case where the plurality of communication areas 211a are located within the reach of an output sound, the condition determining unit 440a of the control server 400a may handle, as a single group, a plurality of sound output terminals 300a located in the plurality of communication areas 211a. That is, the condition determining unit 440a may determine only one representative terminal from among the plurality of sound output terminals 300a located in the plurality of communication areas 211a.

The control server 400a may be, for example, integral with the wireless base stations 210a.

Embodiment 3

Embodiment 3 of the present disclosure is an example in which each of a plurality of sound output terminals controls sound output of the sound output terminal. That is, Embodiment 3 is an example in which each sound output terminal 300 has the functions of the control server 400.

Outline of System

First, an outline of a sound output system including a control device according to the present embodiment is described.

Figure 18:
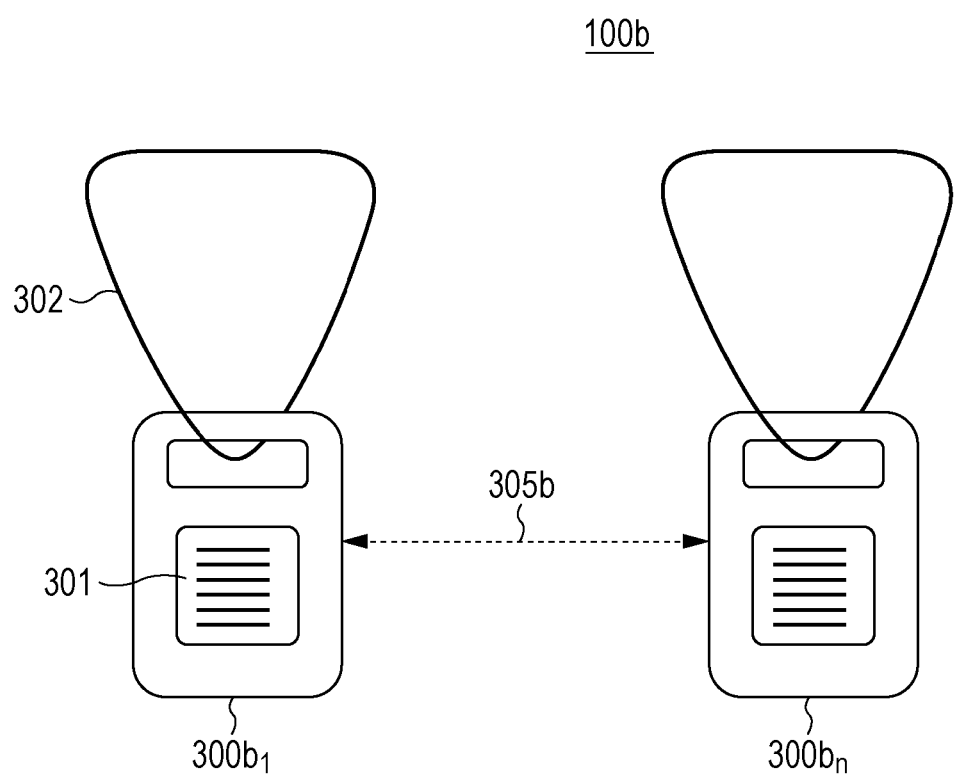
FIG. 18 is a diagram illustrating an example of an outline of a sound output system according to Embodiment 3 of the present disclosure.

FIG. 18 is a diagram illustrating an example of an outline of a sound output system according to the present embodiment and corresponds to FIG. 1 of Embodiment 1. Parts identical to those in FIG. 1 are given identical reference signs, and description thereof is omitted.

As illustrated in FIG. 18, a sound output system 100b has first and n-th sound output terminals $300b_1$ and $300b_1$. Note that the first and n-th sound output terminals $300b_1$ and $300b_n$ have the same configuration and are therefore collectively described as "sound output terminals $300b$" as appropriate.

Each sound output terminal $300b$ exchanges positional information with another sound output terminal $300b$ through wireless communication $305b$.

In a case where the wireless communication $305b$ is near field communication, i.e., in a case where a communicable distance (e.g., 8 m) is shorter than a distance (e.g., 10 m) over which an output sound reaches, the positional information can be a terminal ID. That is, each sound output terminal $300b$ can obtain information indicating that a communication partner is located within a communication area of near field communication by exchanging terminal IDs with another sound output terminal $300b$.

In a case where the wireless communication $305b$ is not near field communication, i.e., in a case where a communicable distance is longer than a distance over which an output sound reaches, the positional information can be terminal positional information obtained from GPS information or the like. That is, by exchanging the terminal positional information with another sound output terminal $300b$, each sound output terminal $300b$ can acquire a relative positional relationship between the sound output terminals $300b$.

In the present embodiment, a case where the wireless communication $305b$ is near field communication and where a communicable distance is shorter than a distance over which an output sound reaches is described. That is, a case where the first and n-th sound output terminals $300b_1$ and $300b_n$ exchange terminal IDs is described.

Each sound output terminal $300b$ includes a control device according to the present disclosure. That is, each sound output terminal $300b$ has a function similar to that of the control server $400$ of Embodiment 1, i.e., a function of controlling output of sounds from a plurality of sound output terminals $300b$.

However, each sound output terminal $300b$ performs simpler sound output control of muting sound output under a condition that a representative terminal is close in a case where the sound output terminal $300b$ is a general terminal.

Note that each sound output terminal $300b$ can communicate, for example, with a plurality of other sound output terminals $300b$. Accordingly, the sound output system $100b$ can include three or more sound output terminals $300b$.

A configuration and an operation of each sound output terminal $300b$ having such a sound control function are described below.

Configuration of Device

Figure 19:
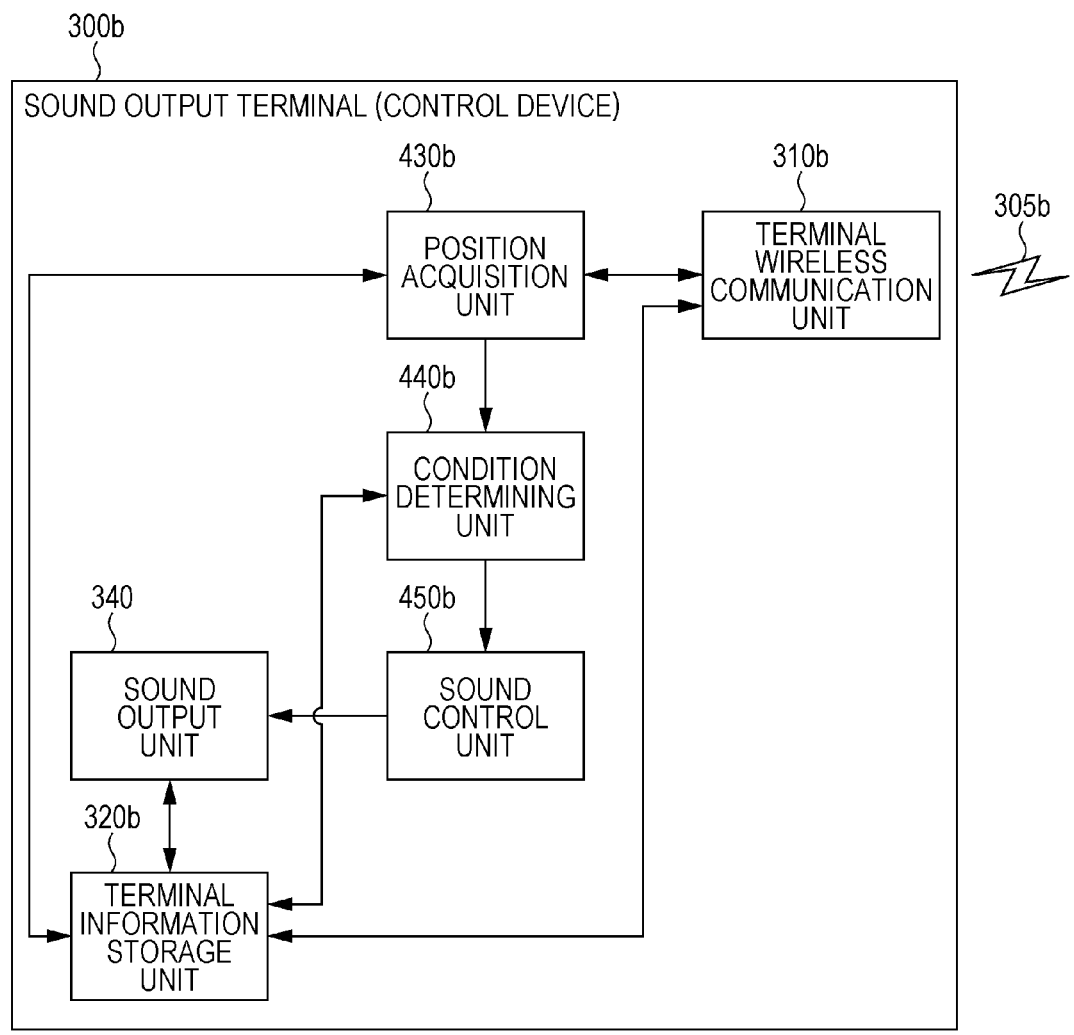
FIG. 19 is a block diagram illustrating an example of a configuration of a sound output terminal according to Embodiment 3.

FIG. 19 is a block diagram illustrating an example of a configuration of each sound output terminal $300b$ and corresponds to FIG. 3 of Embodiment 1. Parts identical to those in FIG. 3 are given identical reference signs, and description thereof is omitted.

In FIG. 19, the sound output terminal $300b$ includes a terminal wireless communication unit $310b$, a terminal information storage unit $320b$, a position acquisition unit $430b$, a condition determining unit $440b$, a sound control unit $450b$, and a sound output unit $340$.

The terminal wireless communication unit $310b$ is communicably connected to another sound output terminal $300b$ through wireless communication $305b$ using a known wireless communication method with the other sound output terminal $300b$. Hereinafter, the other sound output terminal $300b$ to which the terminal wireless communication unit $310b$ is communicably connected is referred to as a "communication partner terminal".

The terminal information storage unit $320b$ stores therein various kinds of information such as a terminal ID and sound data of the sound output terminal $300b$, a terminal ID of a representative terminal, or terminal role information indicating whether or not the sound output terminal $300b$ is a representative terminal. The terminal role information is, for example, information describing an intragroup priority $614$ (see FIG. 4) described in Embodiment 1.

The position acquisition unit $430b$ reads out the terminal ID of the sound output terminal $300b$ from the server information storage unit $420$ and then transmits the terminal ID to the communication partner terminal via the terminal wireless communication unit $310b$. Furthermore, the position acquisition unit $430b$ acquires a terminal ID of a communication partner terminal transmitted from the communication partner terminal via the terminal wireless communication unit $310b$.

That is, the position acquisition unit $430b$ can acquire a terminal ID of another sound output terminal $300b$ located within a communicable distance, i.e., a distance over which an output sound reaches. The acquired terminal ID is positional information indicative of a relative positional relationship among a plurality of sound output terminals $300b$ including the sound output terminal $300b$ and one or a plurality of communication partner terminals. The position acquisition unit $430b$ supplies the acquired communication positional information to the condition determining unit $440b$.

In the following description, the sound output terminal $300b$ and one or a plurality of communication partner terminals indicated by one or a plurality of terminal IDs supplied from the position acquisition unit $430b$ are handled as a group to which the sound output terminal $300b$ belongs.

The condition determining unit $440b$ determines whether or not the sound output terminal $300b$ should function as a general terminal in the group under a condition that one or a plurality of terminal IDs of one or a plurality of communication partner terminals are supplied from the position acquisition unit $430b$. Functioning as a general terminal means that no sound is output (a sound is muted) as described in Embodiment 1. The condition determining unit $440b$ performs this determining process with reference to the terminal role information on the basis of the one or plurality of terminal IDs of the one or plurality of communication partner terminals.

In a case where it is determined that the sound output terminal $300b$ should function as a general terminal, the condition determining unit $440b$ supplies, to the sound control unit $450b$, control instruction information giving an instruction not to output a sound from the sound output terminal $300b$.

For example, assume that a terminal A has received terminal IDs of terminals B through D. In this case, since the intragroup priority of the terminal A is "G1-1", which is the highest, the condition determining unit $440b$ of the terminal A determines that the terminal A should function as a representative terminal.

Meanwhile, for example, assume that the terminal B has received terminal IDs of the terminals A, C, and D. In this case, since the intragroup priority of the terminal B is "G1-2", which is lower than that of the terminal A, the condition determining unit $440b$ of the terminal B determines that the terminal B should function as general terminal.

The sound control unit $450b$ controls sound output of each sound output unit $340$ in accordance with the control instruction information supplied from the condition determining unit 440b. More specifically, in a case where the control instruction information is one giving an instruction not to output a sound from the sound output terminal 300b, the sound control unit 450b lowers a sound volume of sound output.

Note that a hardware configuration of each sound output terminal 300b can be, for example, similar to that of each sound output terminal 300 of Embodiment 1. Note, however, that hardware suitable for the communication described in FIG. 18 is employed as a communication circuit.

Each sound output terminal 300b having such a configuration can switch whether or not the sound output terminal 300b functions as a general terminal by determining by itself whether or not there is a representative terminal within a range in which an output sound reaches. That is, each sound output terminal 300b can control output of sounds from a plurality of sound output terminals 300b by switching whether or not sound output of a representative terminal and sound output of a general terminal are controlled in different ways in accordance with whether or not another sound output terminal 300b that should be a representative terminal is present around the sound output terminal 300b.

Operation of Device

Next, an operation of each sound output terminal 300b is described.

Figure 20:
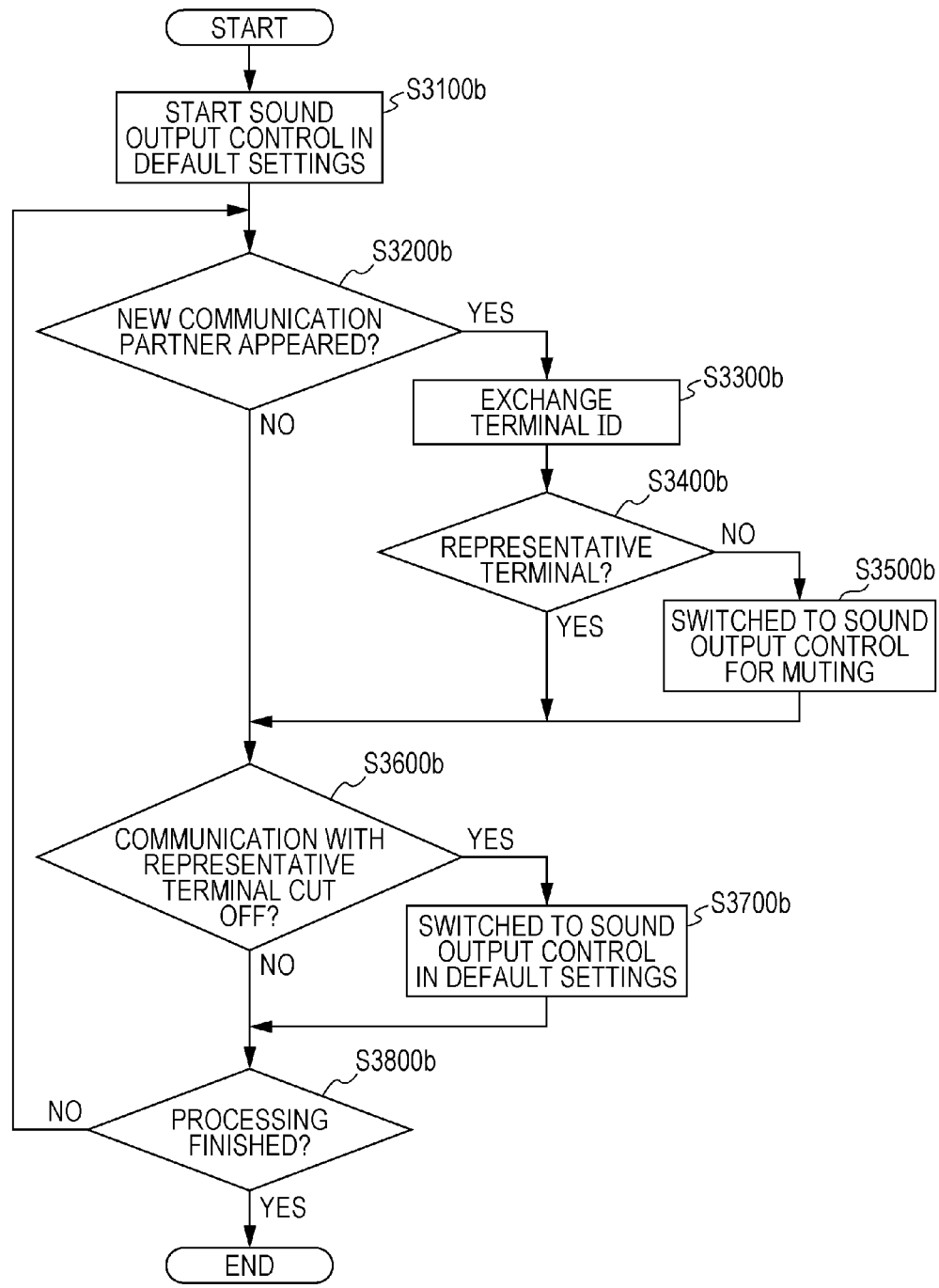
FIG. 20 is a flow chart illustrating an example of an operation of a sound output terminal according to Embodiment 3.

FIG. 20 is a flow chart illustrating an example of an operation of each sound output terminal 300b.

In Step S3100b, the sound control unit 450b starts sound output control in default settings. That is, the sound control unit 450b controls the sound output unit 340 to output a sound at a normal sound volume. Note that the sound control unit 450b may start sound output, for example, after completion of a determining process that will be described later.

In Step S3200b, the position acquisition unit 430b determines whether or not a new communication partner terminal has appeared. That is, the position acquisition unit 430b determines whether or not there is another sound output terminal 300b that has newly become communicable, for example, by approaching.

Note that the position acquisition unit 430b may determine that another sound output terminal 300b is a communication partner terminal only in a case where a received signal intensity or a time length of continued reception of a wireless signal transmitted from the other sound output terminal 300b satisfies a predetermined condition.

In a case where no new communication partner terminal has appeared (NO in S3200b), the position acquisition unit 430b proceeds to Step S3600b that will be described later. Meanwhile, in a case where a new communication partner terminal has appeared (YES in S3200b), the position acquisition unit 430b proceeds to Step S3300b.

In Step S3300b, the position acquisition unit 430b exchanges terminal IDs with the communication partner terminal that has newly appeared.

In Step S3400b, the condition determining unit 440b determines whether or not the sound output terminal 300b in which the condition determining unit 440b is mounted is a representative terminal. In a case where the sound output terminal 300b is a representative terminal (YES in S3400b), the condition determining unit 440b proceeds to Step S3600b that will be described later. Meanwhile, in a case where the sound output terminal 300b is not a representative terminal (NO in S3400b), the condition determining unit 440b proceeds to Step S3500b.

In Step S3500b, the sound control unit 450b starts sound output control in settings for outputting no sound. That is, the sound control unit 450b mutes the sound output unit 340.

In Step S3600b, the position acquisition unit 430b determines whether or not communication with a representative terminal has been cut off. That is, the position acquisition unit 430b determines whether or not communication with the representative terminal has become impossible, for example, because a distance from the representative terminal has becomes longer.

Note that the position acquisition unit 430b may determine that communication with the representative terminal has been cut off only in a case where a received signal intensity or a time length of continued failure of reception of a wireless signal transmitted from the representative terminal satisfies a predetermined condition.

In a case where communication with the representative terminal has not been cut off or in a case where none of the other sound output terminals 300 is a representative terminal of an own group (NO in S3600b), the position acquisition unit 430b proceeds to Step S3800b that will be described later. Meanwhile, in a case where communication with the representative terminal has been cut off (YES in S3600b), the position acquisition unit 430b proceeds to Step S3700b.

In Step S3700b, the sound control unit 450b switches to sound output control in default settings. That is, the sound control unit 450b controls the sound output unit 340 to output a sound at a normal sound volume.

Then, in Step S3800b, the position acquisition unit 430b determines whether or not an instruction to finish the processing for controlling sound output of the sound output terminal 300b has been given by a user's operation or the like. In a case where the instruction to finish the processing has not been given (NO in S3800b), the position acquisition unit 430b returns to Step S3100b. Meanwhile, in a case where the instruction to finish the processing has been given (YES in S3800b), the position acquisition unit 430b finishes the series of processing.

Through the aforementioned operation, each sound output terminal 300b can switch whether or not sound output of a representative terminal and sound output of a general terminal are controlled in different ways in accordance with whether or not a condition that a representative terminal is present within a range in which wireless communication is possible, i.e., within a range in which an output sound reaches is satisfied.

Effects of Present Embodiment

As described above, according to the present embodiment, each sound output terminal 300b determines whether or not a condition that another sound output terminal 300b is located within a distance over which an output sound reaches is satisfied on the basis of acquired positional information. Then, in a case where this condition is satisfied and where the sound output terminal 300b is not a representative terminal, the sound output terminal 300b mutes an output sound.

This allows the sound output terminal 300b to prevent sounds from being output from a large number of sound output terminals 300b in a relatively narrow region and prevent the noises from becoming noisy and hard to hear, thereby maintaining convenience of the sound output terminals 300b.

Modification of Present Embodiment

Note that each sound output terminal 300b may acquire terminal positional information of a plurality of sound output terminals 300b and determine whether or not the sound output terminal 300b should function as a general terminal on the basis of a distribution of the plurality of sound output terminals 300b, in a manner similar to the control server 400 of Embodiment 1. Such a determining method is effective especially in a case where a communicable distance is not necessarily shorter than a distance over which an output sound reaches.

Furthermore, each sound output terminal 300b may determine whether or not another sound output terminal 300b should function as a general terminal in a manner similar to the control server 400 of Embodiment 1. Furthermore, in a case where it is determined that another sound output terminal 300b functions as a general terminal, the sound output terminal 300b may transmit control instruction information giving an instruction to cause the other sound output terminal 300b to function as a general terminal in a manner similar to the control server 400 of Embodiment 1.

Embodiment 4

Embodiment 4 of the present disclosure is an example in which whether or not another sound output terminal is located within a distance over which an output sound reaches and whether or not a sound of the same contents is being reproduced are determined on the basis of detection of an actual output sound.

Outline of System

First, an outline of a sound output system including a control device according to the present embodiment is described.

Figure 21:
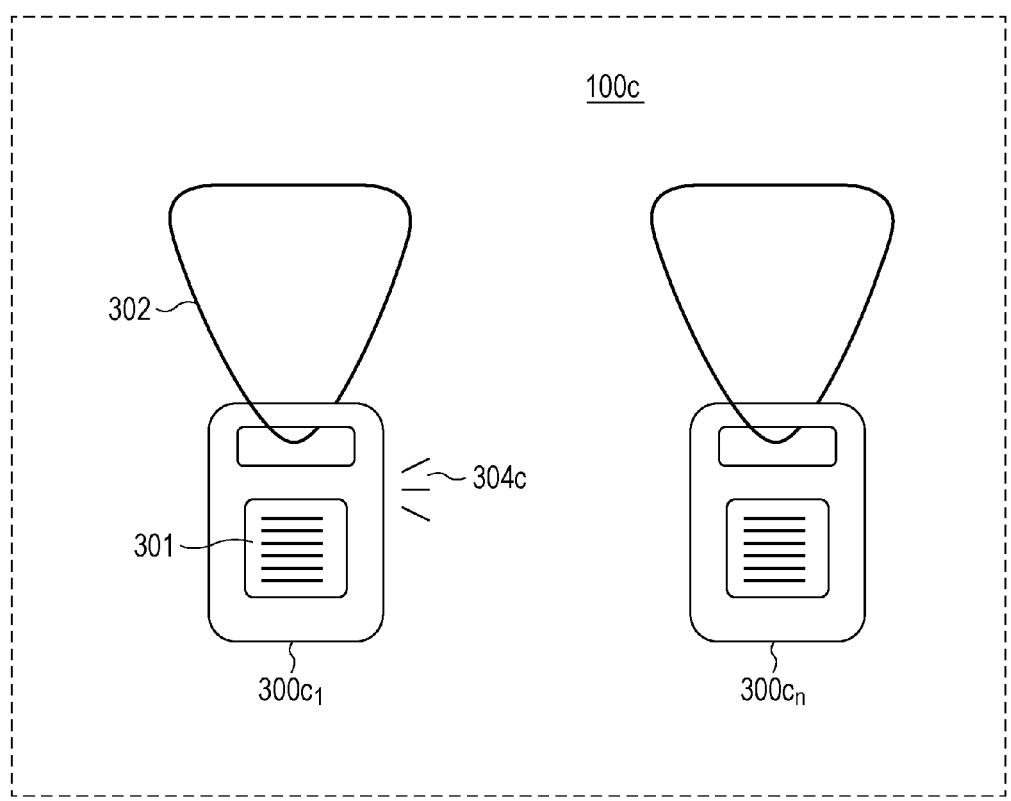
FIG. 21 is a diagram illustrating an example of an outline of a sound output system according to Embodiment 4 of the present disclosure.

FIG. 21 is a diagram illustrating an example of an outline of the sound output system according to the present embodiment and corresponds to FIG. 18 of Embodiment 3. Parts identical to those in FIG. 18 are given identical reference signs, and description thereof is omitted.

As illustrated in FIG. 21, a sound output system 100c includes first and n-th sound output terminals $300c_1$ and $300c_n$. Note that the first and n-th sound output terminals $300c_1$ and $300c_1$ have the same configuration and are therefore collectively described as "sound output terminals 300c" as appropriate.

The first and n-th sound output terminals $300c_1$ and $300c_n$ store therein a set of sound data of the same contents in advance. Therefore, there is a possibility that the first and n-th sound output terminals $300c_1$ and $300c_n$ reproduce sound data of the same contents at overlapping timings.

Each sound output terminal 300c determines whether or not a relative positional relationship with another sound output terminal 300c is one in which these sound output terminals 300c are within the reach of each other's reproduced sounds 304c by detecting the reproduced sound 304c of sound data of the other sound output terminal 300c.

In a case where the reproduced sound 304c from the other sound output terminal 300c is detected, the sound output terminal 300c determines whether or not the sound output terminal 300c and the other sound output terminal 300c are outputting a sound of the same contents. In a case where the sound output terminal 300c and the other sound output terminal 300c are outputting a sound of the same contents and where the sound output terminal 300c is not a representative terminal, the reproduced sound 304c of the sound output terminal 300c is muted.

Note that, for example, reproduced sounds 304c from a plurality of other sound output terminals 300c can reach each sound output terminal 300c. Accordingly, the sound output system 100c can include three or more sound output terminals 300c.

Configuration of Device

Figure 22:
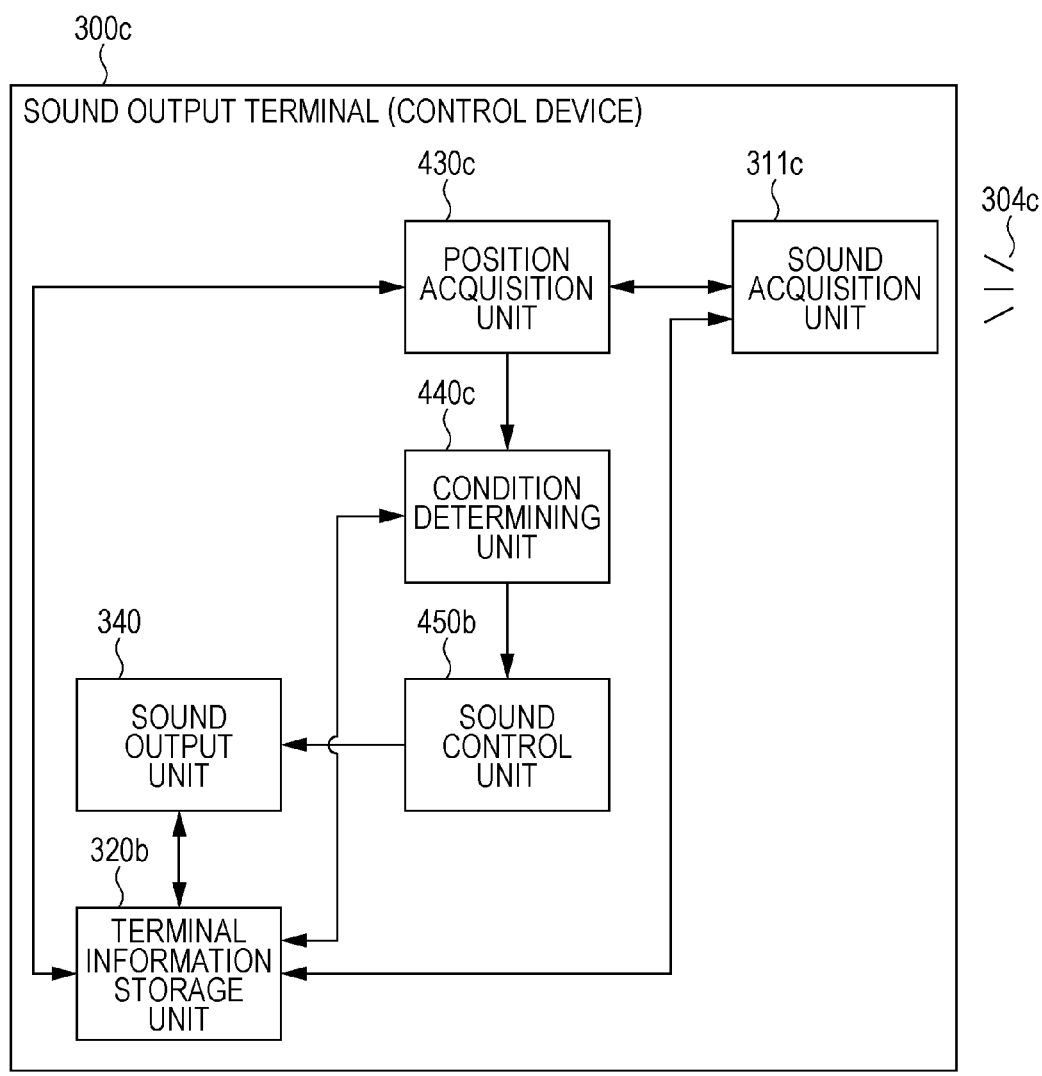
FIG. 22 is a block diagram illustrating an example of a configuration of a sound output terminal according to Embodiment 4.

FIG. 22 is a block diagram illustrating an example of a configuration of each sound output terminal 300c and corresponds to FIG. 19 of Embodiment 3. Parts identical to those in FIG. 19 are given identical reference signs, and description thereof is omitted.

In FIG. 22, each sound output terminal 300c includes a sound acquisition unit 311c, a terminal information storage unit 320c, a position acquisition unit 430c, a condition determining unit 440c, a sound control unit 450b, and a sound output unit 340.

The sound acquisition unit 311c includes, for example, a microphone and acquires an ambient sound. Such an ambient sound can include a reproduced sound 304c from another sound output terminal 300c. The sound acquisition unit 311c converts the acquired ambient sound into sound data and then supplies the sound data to the position acquisition unit 430c. The sound data indicates whether or not the reproduced sound 304c from the other sound output terminal 300c is included and indicates contents of the reproduced sound 304c from the other sound output terminal 300c in a case where the reproduced sound 304c from the other sound output terminal 300c is included.

The terminal information storage unit 320c stores therein various kinds of information such as sound data of the sound output terminal 300c and terminal role information indicating whether or not the sound output terminal 300c is a representative terminal. The terminal role information is, for example, information describing whether or not the sound output terminal 300c is determined in advance as a general terminal or describing a condition under which the sound output terminal 300c functions as a general terminal.

The position acquisition unit 430c acquires sound data of a sound output from the sound output unit 340 from the sound output unit 340. The position acquisition unit 430c compares the sound data (hereinafter referred to as "internal sound data") acquired from the sound output unit 340 and the sound data (hereinafter referred to as "external sound data") supplied from the sound acquisition unit 311c and thus determines the degree of matching between the internal sound data and the external sound data.

The position acquisition unit 430c determines that another sound acquisition unit 311c that is reproducing a sound of the same contents as the sound output terminal 300c is located within the reach of the output sound 304c in a case where the degree of matching between the internal sound data and the external sound data is high. Such a result of the determination is positional information indicative of a relative positional relationship between the sound output terminal 300c and the other sound acquisition unit 311c that is reproducing the sound of the same contents. The position acquisition unit 430c supplies the acquired positional information to the condition determining unit 440c.

Note that the degree of matching between the internal sound data and the external sound data can be determined, for example, by extracting predetermined features from the respective sound data and then calculating similarity (e.g., a distance in a feature space) between the extracted features. The position acquisition unit 430c may determine the degree of matching between the internal sound data and the external sound data on a condition that a sound that is similar to the internal sound data among ambient sounds is acquired at an audible sound volume.

Alternatively, the position acquisition unit 430c may analyze contents of sounds, for example, by extracting words included in the internal sound data and the external sound data through speech recognition processing and determine the degree of matching between the analyzed contents.

In the present embodiment, it is assumed that the sound output unit 340 is performing the process for acquiring sound data of an output sound even while the output sound is being muted. For example, the sound output unit 340 mutes an output sound by blocking input of sound data to a D/A converter (not illustrated) or by reducing an amplitude of an analog sound signal supplied from the D/A converter while continuing to acquire the sound data.

The condition determining unit 440c determines whether or not the sound output terminal 300c should function as a general terminal on a condition that positional information indicating that another sound acquisition unit 311c that is reproducing a sound of the same contents is located within the reach of the output sound 304c is supplied from the position acquisition unit 430c. Functioning as a general terminal means that no sound is output (a sound is muted) as described in Embodiment 1. Such a determining process is performed on the basis of the terminal role information stored in the terminal information storage unit 320c.

For example, assume that the terminal role information indicates that the sound output terminal 300c is set as a general terminal. In this case, the condition determining unit 440c determines that the sound output terminal 300c should function as a general terminal on a condition that the aforementioned positional information has been supplied.

Meanwhile, for example, assume that the terminal role information defines, as a condition on which the sound output terminal 300c is set as a general terminal, a condition that output of the reproduced sound 304c of the same contents is started after another sound output terminal 300c. In this case, the condition determining unit 440c determines that the sound output terminal 300c should function as a general terminal on a condition that the position acquisition unit 430c has acquired the internal sound data after the external sound data. Note that in order to perform such a determining process, the position acquisition unit 430c need supply, to the condition determining unit 440c, information indicating which of the external sound data and the internal sound data has been acquired earlier.

In a case where it is determined that the sound output terminal 300c should function as a general terminal, the condition determining unit 440c supplies, to the sound control unit 450b, control instruction information giving an instruction not to output a sound from the sound output terminal 300c.

Note that a hardware configuration of the sound output terminal 300c can be, for example, similar to that of the sound output terminal 300b of Embodiment 3. However, a communication circuit is not necessarily needed in the sound output terminal 300c.

Each sound output terminal 300c having such a configuration can switch whether or not the sound output terminal 300c functions as a general terminal by determining by itself whether or not another sound output terminal 300c is present within the reach of an output sound. That is, each sound output terminal 300c can control output of sounds from a plurality of sound output terminals 300c by switching whether or not sound output of a representative terminal and sound output of a general terminal are controlled in different ways in accordance with whether or not another sound output terminal 300c that should function as a representative terminal is present around the sound output terminal 300c.

Operation of Device

Next, an operation of the sound output terminal 300c is described.

Figure 23:
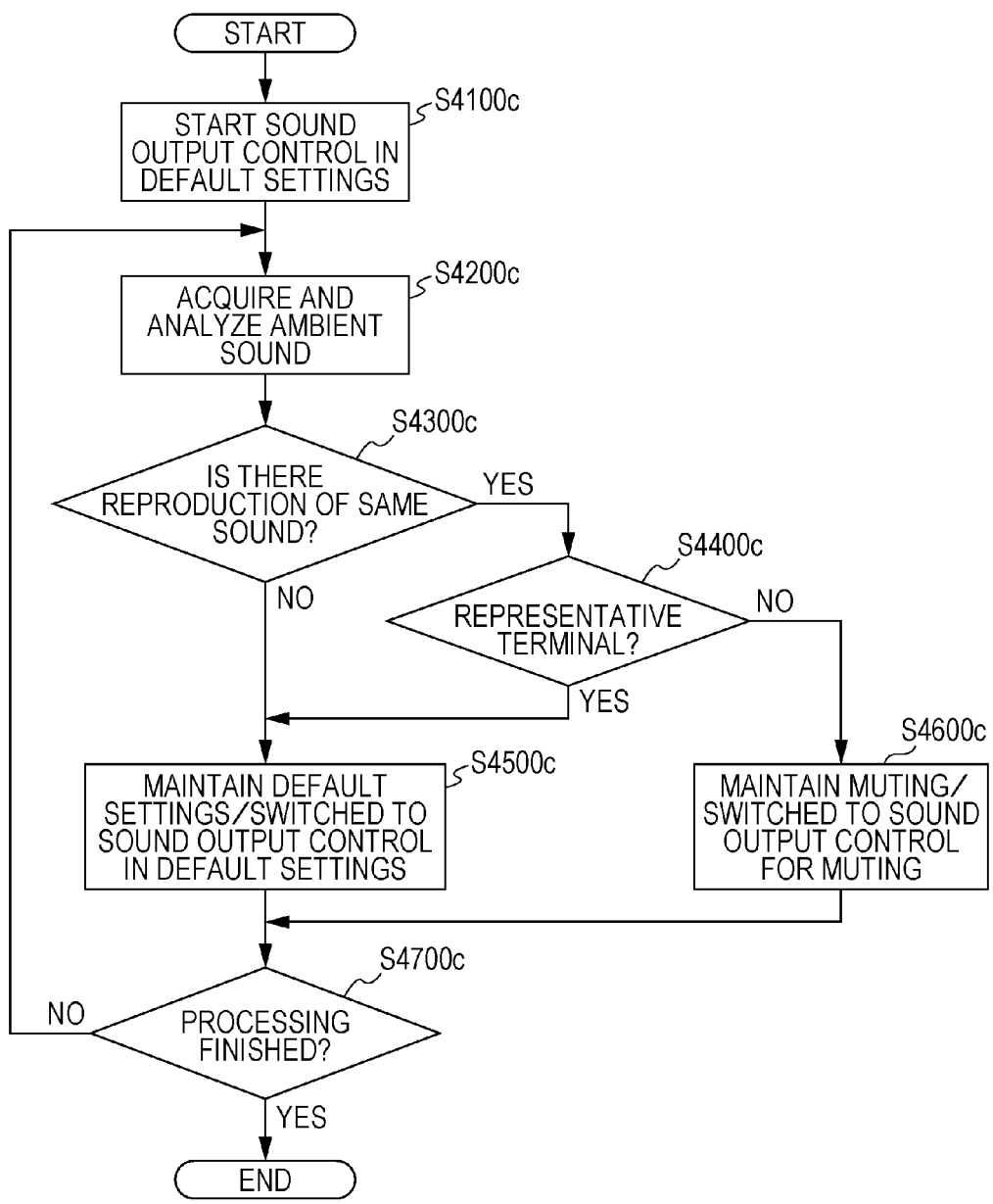
FIG. 23 is a flow chart illustrating an example of an operation of a sound output terminal according to Embodiment 4.

FIG. 23 is a flow chart illustrating an example of the operation of the sound output terminal 300c.

In Step S4100c, the sound control unit 450b starts sound output control in default settings. That is, the sound control unit 450b controls the sound output unit 340 to output a sound at a normal sound volume. Note that the sound control unit 450b may start output of a sound, for example, after completion of a determining process that will be described later.

In Step S4200c, the sound acquisition unit 311c acquires an ambient sound. Then, the position acquisition unit 430c analyzes the ambient sound, for example, by comparing internal sound data and external sound data.

In Step S4300c, the position acquisition unit 430c determines whether or not a sound of the same contents is being reproduced around the sound output terminal 300c. That is, the position acquisition unit 430c determines whether or not the ambient sound includes, at an audible sound volume, a sound of the same contents as a sound that is being reproduced or a sound that is about to be reproduced by the sound output unit 340.

The sound data to be compared with the internal sound data may be the latest time section among time sections having a predetermined length (e.g., 5 seconds) obtained by dividing sound data of the ambient sound (hereinafter referred to as "ambient sound data") from the start thereof or may be a moving time section that is the last predetermined length (e.g., 5 seconds) from a current time. The internal sound data to be compared with the ambient sound data may be the latest time section among time sections having a predetermined length (e.g., 5 seconds) obtained by dividing the internal sound data supplied from the sound output unit 340 from the start thereof or may be a moving time section that is the last predetermined length (e.g., 5 seconds) from a current time.

In a case where the sound of the same contents is not being reproduced around the sound output terminal 300c (NO in S4300c), the position acquisition unit 430c proceeds to Step S4500c that will be described later. Meanwhile, in a case where the sound of the same contents is being reproduced around the sound output terminal 300c (YES in S4300c), the position acquisition unit 430c proceeds to Step S4400c.

In Step S4400c, the condition determining unit 440c determines whether or not the sound output terminal 300c in which the condition determining unit 440c is mounted is a representative terminal. In a case where the sound output terminal 300b is a representative terminal (YES in S4400c), the condition determining unit 440c proceeds to Step S4500c. Meanwhile, in a case where the sound output terminal 300c is not a representative terminal (NO in S4400c), the condition determining unit 440c proceeds to Step S4600c that will be described later.

In Step S4500c, the sound control unit 450b maintains sound output control in default settings or switch to sound output control in default settings. That is, the sound control unit 450b controls the sound output unit 340 to output a sound at a normal sound volume.

Meanwhile, in Step S4600c, the sound control unit 450b maintains settings for outputting no sound or switch to sound output control for outputting no sound. That is, the sound control unit 450b controls the sound output unit 340 to keep muting a sound or start muting a sound.

Then, in Step S4700c, the position acquisition unit 430c determines whether or not an instruction to finish the processing for controlling sound output of the sound output terminal 300c has been given. In a case where the instruction to finish the processing has not been given (NO in S4700c), the position acquisition unit 430c returns to Step S4200c. Meanwhile, in a case where the instruction to finish the processing has been given (YES in S4700c), the position acquisition unit 430c finishes the series of processing.

Note that in a case where all of a plurality of sound output terminals 300c located within the reach of an output sound is a general terminal, there is a possibility that all of these plurality of sound output terminals 300c mute a reproduced sound.

In view of this, a determination standby period that differs from one sound output terminal 300c to another may be set in the condition determining unit 440c. Each condition determining unit 440c determines that a reproduced sound is muted only in a case where a sound of the same contents is being continuously reproduced only for the set determination standby period. The determination standby period can be, for example, a random number value generated for each sound output terminal 300c.

For example, assume that a sound output terminal 300c in which a determination standby period of 3 seconds is set and a sound output terminal 300c in which a determination standby period of 4 seconds is set concurrently start reproducing the same sound data within a short distance. In this case, the sound output terminal 300c in which a determination standby period of 3 seconds is set mutes a reproduced sound earlier. As a result, the sound output terminal 300c in which a determination standby period of 4 seconds is set changes from a general terminal to a representative terminal.

By thus setting a determination standby period that differs from one sound output terminal 300c to another, it is possible to prevent a plurality of sound output terminals 300c from concurrently muting a reproduced sound. That is, the condition determining unit 440c can dynamically determine whether or not the sound output terminal 300c should function as a representative terminal.

Through the aforementioned operation, each sound output terminal 300c can switch whether or not sound output of a representative terminal and sound output of a general terminal are controlled in different ways in accordance with whether or not a condition that a representative terminal is present within the reach of a reproduced sound is satisfied.

Effects of Present Embodiment

As described above, according to the present embodiment, each sound output terminal 300c determines whether or not a condition that another sound output terminal 300c is located within a distance over which an output sound reaches is satisfied on the basis of acquired positional information. The sound output terminal 300c mutes an output sound in a case where the condition is satisfied and where the sound output terminal 300c is not a representative terminal.

This allows the sound output terminal 300c to prevent sounds from being output from a large number of sound output terminals 300c in a relatively narrow region and prevent the sounds from becoming noisy and hard to hear, thereby maintaining convenience of the sound output terminals 300c.

Modification of Present Embodiment

Note that a method for determining whether or not a sound of the same contents is being reproduced can vary depending on the length of internal sound data. For example, in a case where a plurality of pieces of short internal sound data of 10 seconds or shorter are stored in the terminal information storage unit 320c, the position acquisition unit 430c may compare each of the pieces of internal sound data with sound data of an ambient sound (hereinafter referred to as "ambient sound data").

The sound output terminal 300c may estimate an environment in which a plurality of sound output terminals 300c are used on the basis of a collected ambient sound and control output of sounds from the plurality of sound output terminals 300c on the basis of the estimated environment.

For example, the condition determining unit 440c receives ambient sound data and determines whether or not a sound volume of the ambient sound is equal to or higher than a predetermined level (e.g., 70 dB). In a case where the sound volume is equal to or higher than the predetermined level, the condition determining unit 440c determines that a dominant sound such as noise, a siren, or an amplified sound in a meeting is present around the sound output terminal 300c and determines that sound output of the sound output terminal 300c is stopped.

Furthermore, for example, the condition determining unit 440c receives ambient sound data and determines whether or not a feature (voiceprint) indicative of a predetermined instruction ID is included. The instruction ID is information giving an instruction to control sound output and is associated in advance with specific control such as stoppage of sound output. In a case where the predetermined instruction ID is included, the condition determining unit 440c stops sound output or changes an output sound so that the output sound does not overlap an ambient sound in accordance with the instruction ID.

Specifically, for example, in a case where a first animal quiz is being reproduced around the sound output terminal 300c in a zoo or the like, the condition determining unit 440c determines that a second animal quiz different from the first animal quiz is reproduced. Furthermore, for example, in a case where a sound including an instruction ID giving, for example, an instruction from a business manager to take a regular break or check whether it is raining outside a store is reproduced in a building such as a commercial facility or a factory, the condition determining unit 440c detects this sound. Then, the condition determining unit 440c determines that reproduction of the same sound specified by the instruction ID is stopped or suspended or sound content needed for next action of staff members or operators is reproduced.

Furthermore, for example, the condition determining unit 440c receives ambient sound data and determines whether or not a user of the sound output terminal 300c is having a conversation on the basis of voiceprint data or the like of the user that is registered in advance. Furthermore, the condition determining unit 440c determines importance of sound data (hereinafter referred to as "reproduced content") that is being reproduced or about to be reproduced on the basis of importance that is preset for each sound data. In a case where the importance of reproduced content is low, the condition determining unit 440c determines that reproduction is stopped until the conversation is over. Meanwhile, in a case where the importance of reproduced content is high, the condition determining unit 440c determines that reproduction is started after a jingle sound that prompts the user to stop the conversation is reproduced. This makes it possible to avoid a situation where a reproduced sound suddenly interrupts the conversation.

Furthermore, for example, the condition determining unit 440c receives ambient sound data and determines whether or not a user is having a conversation with a customer on the basis of a predetermined feature such as the number of conversation partners. Then, the condition determining unit 440c determines that a sound volume is lowered (including stoppage of reproduction) for a predetermined period from the end of the user's conversation.

Furthermore, for example, the condition determining unit 440c receives ambient sound data and determines whether or not the sound output terminal 300c is located indoors on the basis of the level of a reverberation sound or the like. In a case where it is determined that the sound output terminal 300c is located indoors, the condition determining unit 440c determines that a sound volume of an output sound is made lower as compared with a case where it is not determined that the sound output terminal 300c is located indoors.

Furthermore, for example, the condition determining unit 440c may receive ambient sound data, estimate an attribute of a user such as sex and age of the user from a vocal sound and conversation contents included in an ambient sound, and determine, as sound data to be reproduced, sound data that matches the estimated attribute. For example, in a case where the user is a male, the condition determining unit 440c reproduces guide content by using female voice, whereas in a case where the user is a female, the condition determining unit 440c reproduces guide content by using male voice. In a case where the user is young, the condition determining unit 440c obtains a name of a popular character included in a conversation from the conversation and determines that content concerning the popular character is reproduced.

Furthermore, for example, the condition determining unit 440c receives ambient sound data and determines whether or not a feature indicative of a predetermined instruction ID or space ID is included. In a case where the predetermined instruction ID or space ID is included, the condition determining unit 440c determines that sound output is stopped or a sound volume thereof is lowered for a predetermined period. Note that the predetermined period may be determined on the basis of the instruction ID included in the ambient sound or may be set in advance.

Specifically, for example, the condition determining unit 440c determines that sound output is stopped or a sound volume is lowered upon detection of a space ID indicative of a crowded place or a place that requires quietness such as a train, a plane, a museum, a theater, or a temple. Furthermore, for example, upon detection of an instruction ID giving an instruction to stop sound output or lower a sound volume, the condition determining unit 440c determines that sound output is stopped or a sound volume is lowered in accordance with the instruction.

FIG. 33 is a block diagram illustrating hardware elements of a control device and a sound output terminal according to each of the embodiments. Among the elements illustrated in FIG. 33, the control device 400a includes, as hardware elements, a CPU (Central Processing Unit) 18, a RAM (Random Access Memory) 20, a built-in storage 22 in which information is stored, a reading device 24 that reads information from a storage medium such as a USB (Universal Serial Bus) memory, and a transmitting/receiving device 26 for communication over a network. These elements are connected to one another via a bus 28.

The reading device 24 reads out a program for realizing the functions of the units from a storage medium in which the program is stored and then causes the program to be stored in the built-in storage 22. Alternatively, the program for realizing the functions of the units may be stored in advance in the built-in storage 22.

The CPU 18 copies the program stored in the built-in storage 22 into the RAM 20, sequentially reads out commands included in the program from the RAM 20, and execute the commands. The functions of the units are thus realized. Note that information obtained in various kinds of processing performed upon execution of the program is stored in the RAM 20 or the built-in storage 22 and is used as appropriate.

Among the elements illustrated in FIG. 33, each sound output terminal 300c includes, as hardware elements, an input device 14 such as an input button and a touch panel, an output device 16 such as a display and a speaker, a CPU (Central Processing Unit) 18, a RAM (Random Access Memory) 20, a built-in storage 22 in which information is stored, a reading device 24 that reads out information from a storage medium such as a USB (Universal Serial Bus) memory, and a transmitting/receiving device 26 for communication over a network. These elements are connected to one another via a bus 28.

The reading device 24 reads out a program for realizing the functions of the units from a storage medium in which the program is stored and then causes the program to be stored in the built-in storage 22. Instead of such an arrangement, the transmitting/receiving device 26 may download the program for realizing the functions of the units from a server device by communicating with the control device 400a over the network and then cause the downloaded program to be stored in the built-in storage 22. Alternatively, the program for realizing the functions of the units may be stored in advance in the built-in storage 22.

The CPU 18 copies the program stored in the built-in storage 22 into the RAM 20, sequentially reads out commands included in the program from the RAM 20, and execute the commands. The functions of the units are thus realized. Note that information obtained in various kinds of processing performed upon execution of the program is stored in the RAM 20 or the built-in storage 22 and is used as appropriate.

Whole Picture of Provided Service

A specific example of the whole picture of a sound output system according to each of the embodiments described above is described.

Figure 24:
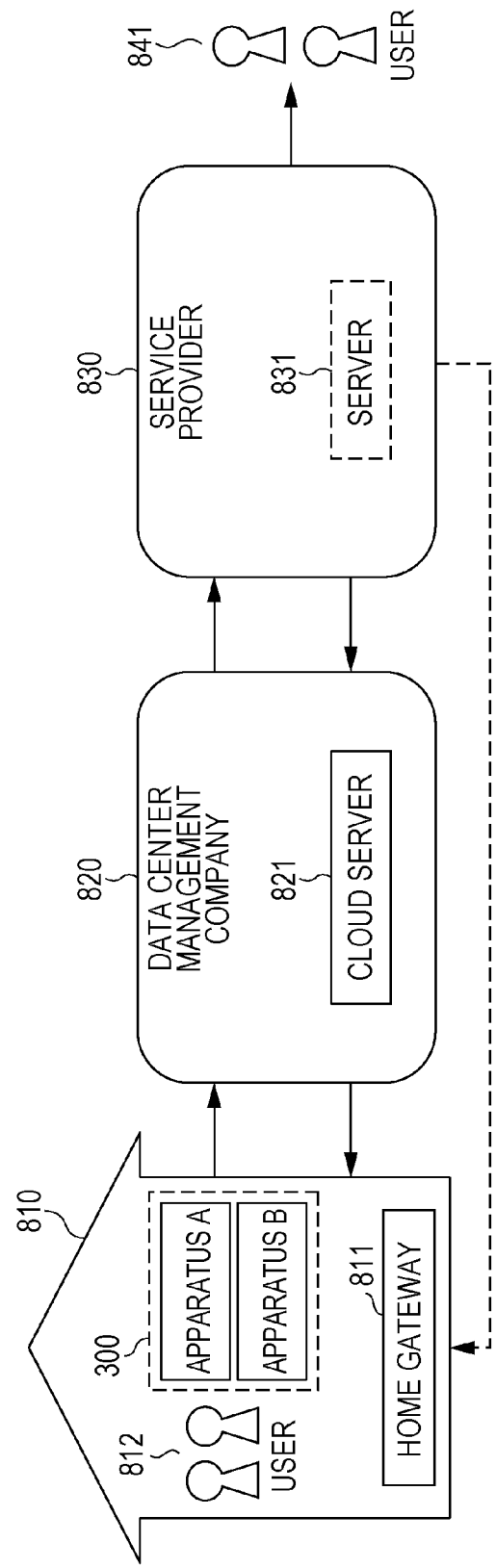
FIG. 24 is a diagram illustrating a first example of the whole picture of a sound output system according to each of the embodiments.

FIG. 24 illustrates an example of the whole picture of a sound output system according to each of the embodiments.

A group 810 is, for example, a company, an organization, a household, or the like, and the scale of the group 810 is not limited. The group 810 includes apparatuses A and B, which are a plurality of sound output terminals 300, and a home gateway 811. The plurality of sound output terminals 300 include apparatuses (e.g., a smartphone, a tablet-type information terminal, or the like) connectable to the Internet and apparatuses (e.g., a mobile music player or the like) that are not connectable to the Internet by themselves. The plurality of sound output terminals 300 may include apparatuses that are not connectable to the Internet by themselves but can be connected to the Internet via the home gateway 811. In the group 810, users 812 who use the plurality of sound output terminals 300 exist.

A data center management company 820 includes a cloud server 821 (e.g., the control server 400, 400a). The cloud server 821 is a virtual server that works in cooperation with various apparatuses over the Internet. The cloud server 821 mainly manages enormous data (big data) or the like that is difficult to handle with the use of a general database management tool or the like. The data center management company 820, for example, manages data and the cloud server 821 and runs a data center for management of the data and the cloud server 821. Details of service provided by the data center management company 820 will be described later.

Figure 25:
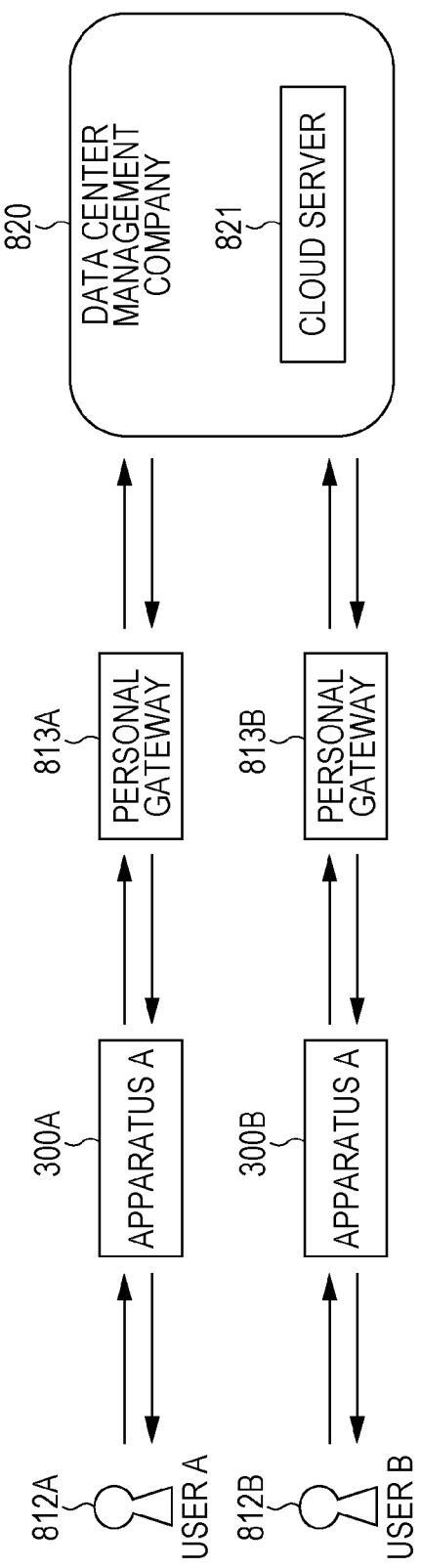
FIG. 25 is a diagram illustrating a second example of the whole picture of a sound output system according to each of the embodiments.

Note that the apparatuses A and B may indirectly communicate with the cloud server 821 via personal gateways 813A and 813B such as a mobile phone and a wireless communication router, respectively (see FIG. 25).

Figure 26:
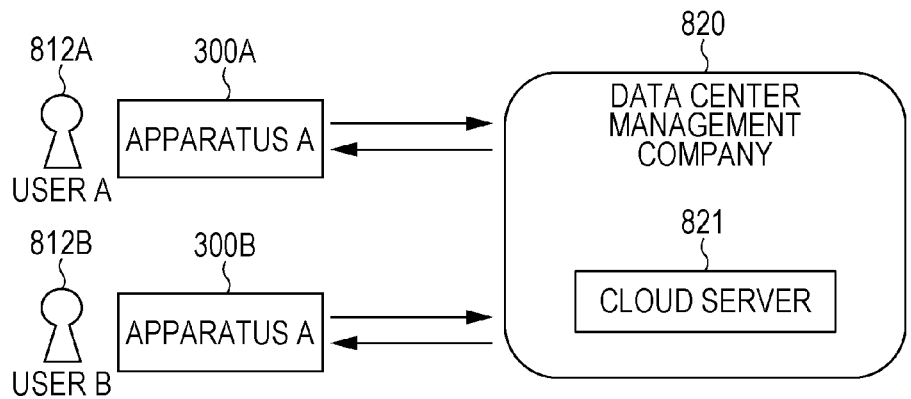
FIG. 26 is a diagram illustrating a third example of the whole picture of a sound output system according to each of the embodiments.

Alternatively, the apparatus A used by a user A and the apparatus B used by a user B may directly communicate with the cloud server 821 without using a gateway (see FIG. 26).

The data center management company 820 is not limited to a company for management of data, management of the cloud server 821, or the like only.

Figure 27:
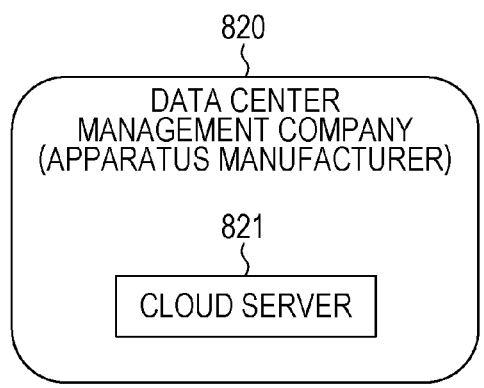
FIG. 27 is a diagram illustrating a fourth example of the whole picture of a sound output system according to each of the embodiments.

For example, there are cases where a manufacturer that develops or manufactures one of the plurality of sound output terminals 300 is also in charge of management of data, management of the cloud server 821, or the like. In such cases, the manufacturer corresponds to the data center management company 820 (see FIG. 27).

Figure 28:
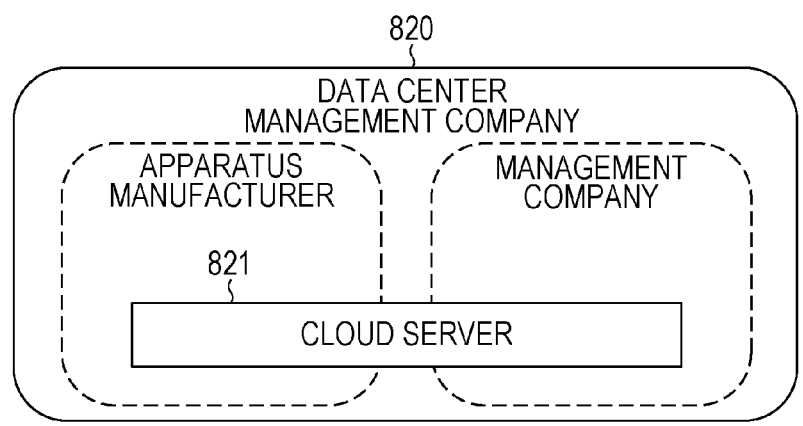
FIG. 28 is a diagram illustrating a fifth example of the whole picture of a sound output system according to each of the embodiments.

The data center management company 820 is not limited to a single company. For example, there are cases where a manufacturer and a management company are jointly or separately in charge of management of data or management of the cloud server 821. In such cases, both of or either one of the manufacturer and the management company correspond(s) to the data center management company 820 (see FIG. 28).

A service provider 830 includes a server 831. The scale of the server 831 is not limited, and examples thereof include a memory of a personal computer. The service provider 830 may include no server 831.

Note that the home gateway 811 is not essential in the service described above. For example, in a case where the cloud server 821 is in charge of management of all data, the home gateway 811 is unnecessary. Furthermore, there are cases where there is no apparatus that is not connectable to the Internet by itself like a case where all apparatuses in a household are connected to the Internet.

Next, a flow of information in the service is described.

First, the apparatus A or the apparatus B of the group 810 transmits log information to the cloud server 821 of the data center management company 820. The cloud server 821 accumulates therein the log information of the apparatus A or the apparatus B (FIG. 24).

The log information is information indicative of date and time of operation or the like of the plurality of sound output terminals 300. For example, the log information is a history of reproduction of sound data or the like, but is not limited to this and includes all kinds of information that can be acquired from all kinds of apparatuses. The log information is sometimes provided directly to the cloud server 821 from the plurality of sound output terminals 300 themselves over the Internet. Alternatively, the log information may be supplied from the plurality of sound output terminals 300 to the home gateway 811 and accumulated in the home gateway 811 and be then supplied from the home gateway 811 to the cloud server 821.

Next, the cloud server 821 of the data center management company 820 provides the accumulated log information to the service provider 830 by a constant unit. The constant unit may be one that allows the information accumulated in the data center management company 820 to be provided to the service provider 830 in an organized manner or may be one requested by the service provider 830. Although the expression "constant unit" is used, the unit need not be constant, and the amount of provided information may vary depending on the situation.

The log information is stored in the server 831 of the service provider 830 as needed (FIG. 24). Then, the service provider 830 organizes the log information into information suitable for service provided to users and provides the tag information to the users. The users to which the log information is provided may be the users 812 who use the plurality of sound output terminals 300 or may be outside users 841.

The service may be provided, for example, directly from the service provider 830 to the users. Alternatively, the service may be, for example, provided to the users via the cloud server 821 of the data center management company 820. Alternatively, the cloud server 821 of the data center management company 820 may organize the log information into information suitable for the service provided to users and provide the log information to the service provider 830.

The users 812 and the users 841 may be different from each other or may be the same as each other.

Type of Applied Cloud Service

Note that a sound output system according to each of the above embodiments constitutes, for example, a service of cloud computing provided on the basis of data collected from users. That is, the technique described in the above embodiments can be, for example, realized in the following cloud service types. However, the type of cloud service in which the technique described in the above embodiments is realized is not limited to these types.

Service Type 1: In-House Data Center Type

Figure 29:
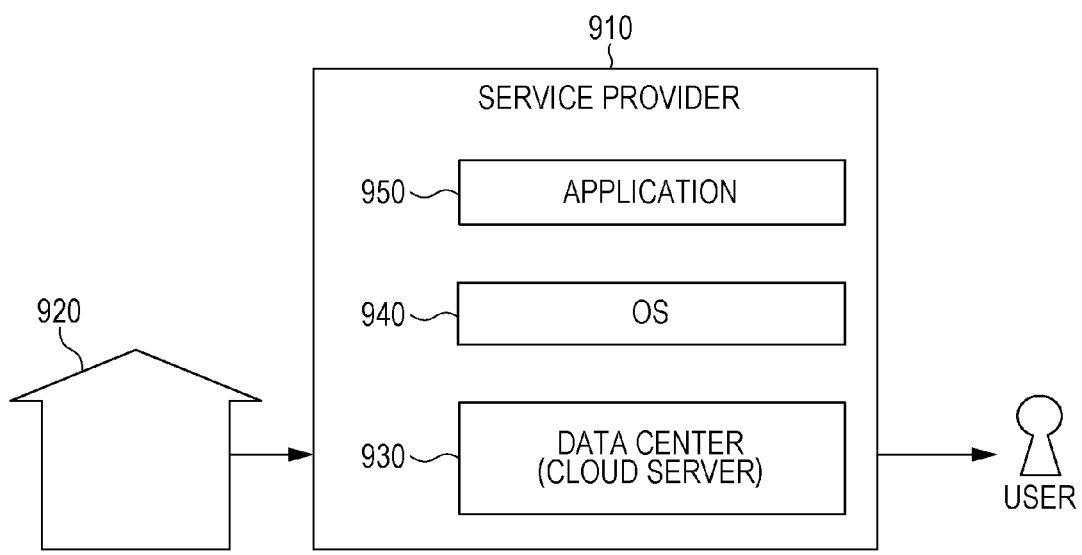
FIG. 29 is a diagram illustrating a first example of a service type according to each of the embodiments.

FIG. 29 is a diagram illustrating Service Type 1 (In-House Data Center Type).

In this type, a service provider 910 acquires information from a group 920 and provides service to a user. In this type, the service provider 910 has a function of a data center management company. That is, the service provider 910 has a cloud server 930 (e.g., the control server 400, 400a) that manages big data. Therefore, there is no data center management company.

In this type, the service provider 910 runs and manages a data center (cloud server 930). Furthermore, the service provider 910 manages an OS 940 and an application 950. The service provider 910 provides the service by using the OS 940 and the application 950 managed in the service provider 910.

Service Type 2: IaaS Type

Figure 30:
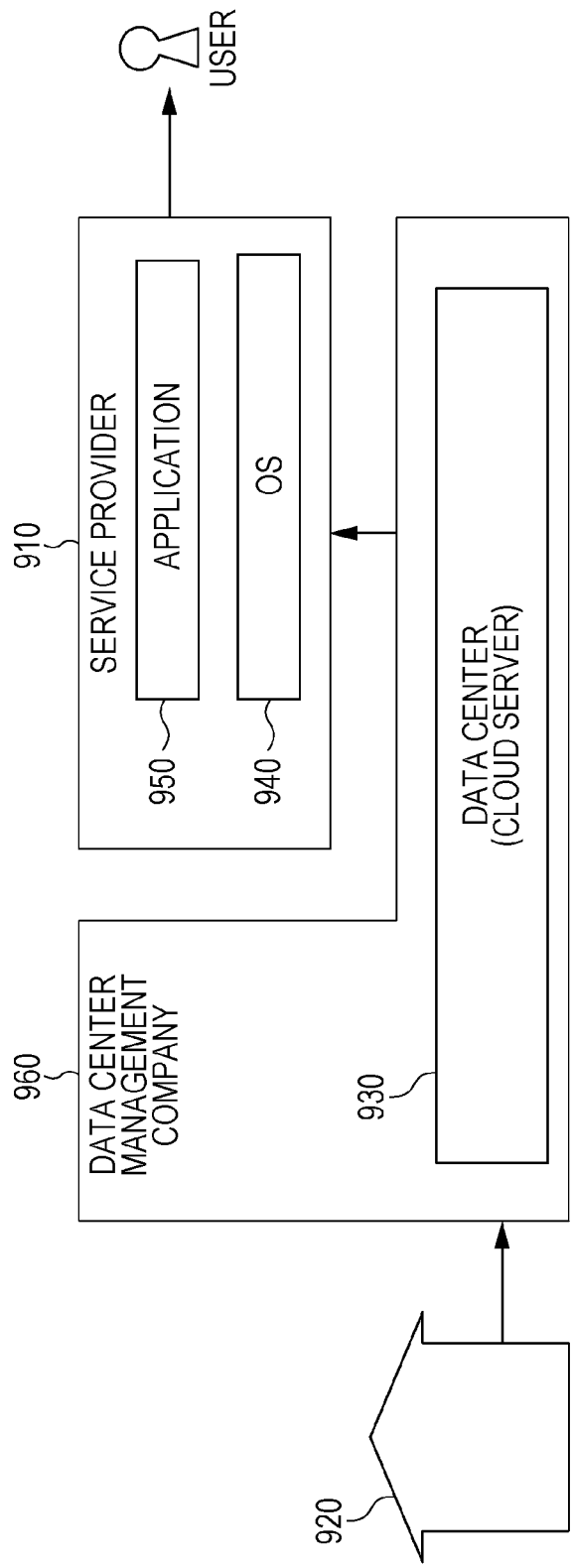
FIG. 30 is a diagram illustrating a second example of a service type according to each of the embodiments.

FIG. 30 is a diagram illustrating Service Type 2 (IaaS Type).

IaaS is an abbreviation of Infrastructure as a Service and is a cloud service providing model that provides an infrastructure itself for construction and operation of a computer system as a service over the Internet.

In this type, a data center management company 960 runs and manages a data center (cloud server 930). Furthermore, the service provider 910 manages an OS 940 and an application 950. The service provider 910 provides the service by using the OS 940 and the application 950 managed by the service provider 910.

Service Type 3: PaaS Type

Figure 31:
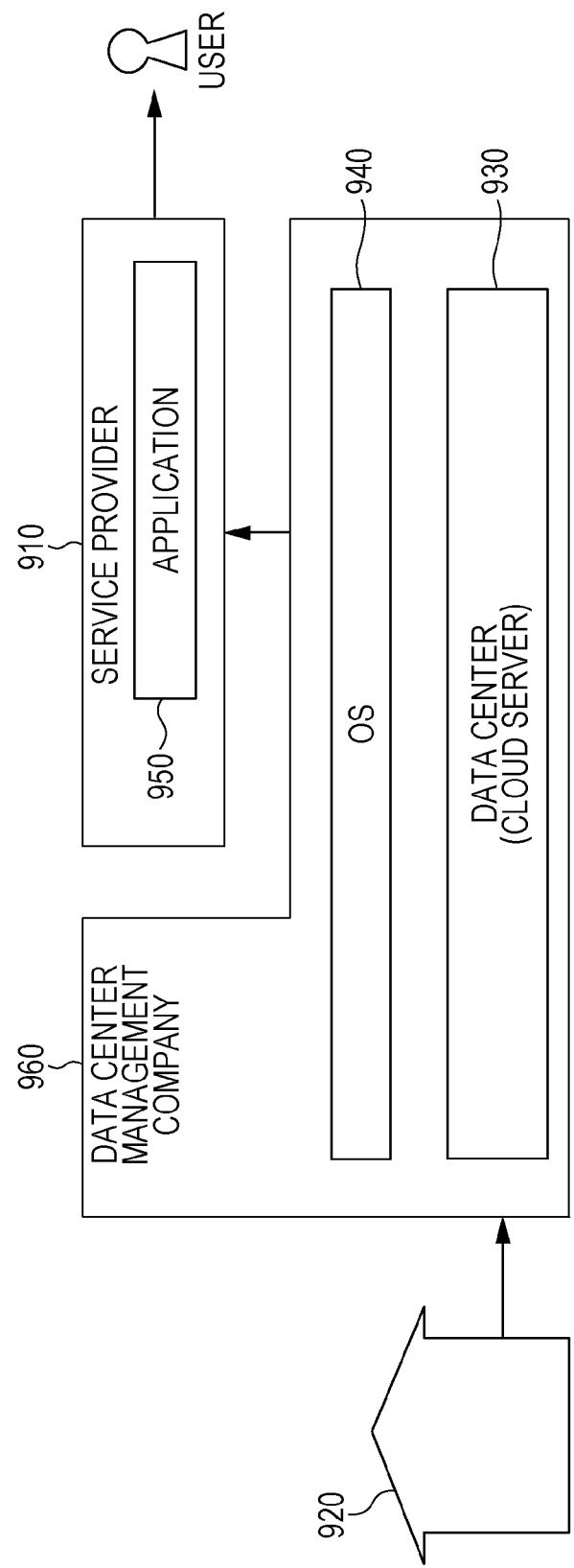
FIG. 31 is a diagram illustrating a third example of a service type according to each of the embodiments.

FIG. 31 is a diagram illustrating Service Type 3 (PaaS Type).

PaaS is an abbreviation of Platform as a Service and is a cloud service providing model that provides a platform for construction and operation of software as a service over the Internet.

In this type, the data center management company 960 manages an OS 940 and runs and manages a data center (cloud server 930). Furthermore, the service provider 910 manages an application 950. The service provider 910 provides the service by using the OS 940 managed by the data center management company 960 and the application 950 managed by the service provider 910.

Service Type 4: SaaS Type

Figure 32:
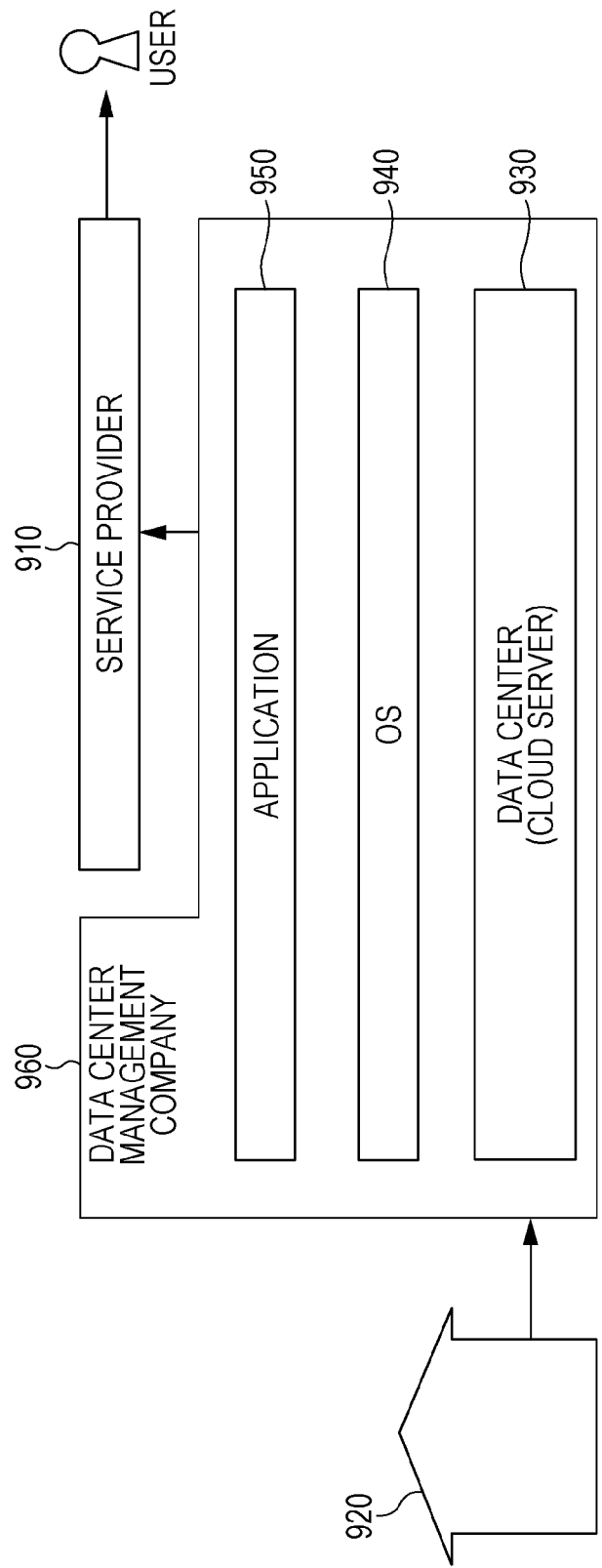
FIG. 32 is a diagram illustrating a fourth example of a service type according to each of the embodiments.

FIG. 32 is a diagram illustrating Service Type 4 (SaaS Type).

SaaS is an abbreviation of Software as a Service. For example, the SaaS type cloud service is a cloud service providing model that allows a company or an individual (user) that does not have a data center (cloud server) to use an application provided by a platform provider that has a data center (a cloud server) over a network such as the Internet.

In this type, the data center management company 960 manages an application 950 and an OS 940 and runs and manages a data center (cloud server) 930. The service provider 910 provides service by using the OS 940 and the application 950 managed by the data center management company 960.

In any of the cloud service types described above, the service provider 910 provides service. For example, the service provider or the data center management company may develop an OS, an application, a database for big data, or the like by itself or may outsource development of an OS, an application, a database for big data, or the like to a third party.

The present disclosure is useful as a control method and a control device that can maintain convenience of a sound output terminal.

What is claimed is:

1. A control method in a control device including a processor, the control method comprising:
  acquiring, by the processor, items of positional information indicative of positions of a plurality of terminals from the plurality of terminals through communication; and
  determining, by the processor, one or more representative terminals from among the plurality of terminals in accordance with a state of distribution of the positions of the plurality of terminals,
  transmitting, to the one or more representative terminals, when the items of positional information satisfy a predetermined condition, a first command to cause the one or more representative terminals to output a sound at a first sound volume, and, transmitting to one or more general terminals, a second command to cause the one or more general terminals to output a sound at a second sound volume different from the first sound volume, the one or more general terminals being different than the one or more representative terminals, and
  transmitting, to the one or more representative terminals and to the one or more general terminals, when the items of positional information do not satisfy the predetermined condition, a third command to cause the one or more representative terminals and the one or more general terminals to output a sound at a third sound volume.

2. The control method according to claim 1, wherein the predetermined condition comprises that a distance between the one or more representative terminals and the one or more general terminals is equal to or shorter than a predetermined value.

3. The control method according to claim 1, wherein the second sound volume is lower than the first sound volume.

4. The control method according to claim 1, wherein the items of positional information include GPS information.

5. The control method according to claim 1, wherein the one or more representative terminals are determined in advance.

6. The control method according to claim 1, wherein
  the plurality of terminals are divided into a plurality of groups on basis of the distribution of the positions;
  the plurality of groups include a first group and a second group;
  the one or more representative terminals include a first representative terminal and a second representative terminal;
  the one or more general terminals include a first general terminal and a second general terminal;
  the first representative terminal and the first general terminal belong to the first group;
  the second representative terminal and the second general terminal belong to the second group; and
  determining the first representative terminal such that a distance between the first representative terminal and the second representative terminal is longer than a distance between the first representative terminal and the second general terminal.

7. The control method according to claim 1, wherein the predetermined condition comprises that the positions of the plurality of terminals indicated by the items of positional information are within a predetermined region.

8. A control device comprising:
  a memory including executable instructions, and
  a processor that executes the instructions and performs:
  acquiring items of positional information indicative of positions of a plurality of terminals, from the plurality of terminals;
  determining one or more representative terminals from among the plurality of terminals in accordance with a state of distribution of the positions; of the terminals
  transmitting, to the one or more representative terminals, a first command to cause the one or more representative terminals to output a sound at a first sound volume and transmitting, to one or more general terminals, that are different from the one or more representative terminals, a second command to cause the one or more general terminals to output a sound at a second sound volume different from the first sound volume, when the items of positional information satisfy a predetermined condition, and
  transmitting, to the one or more representative terminals and the one or more general terminals, a third command to cause the one or more representative terminals and the one or more general terminals to output a sound at a third sound volume, when the items of positional information do not satisfy the predetermined condition.

9. The control device according to claim 8, wherein the control device is included in each of the plurality of terminals.

10. The control device according to claim 8, wherein the predetermined condition comprises that a distance between the one or more representative terminals and the one or more general terminals is equal to or shorter than a predetermined value.

11. The control device according to claim 8, wherein the second sound volume is lower than the first sound volume.

12. The control device according to claim 8, wherein the items of positional information include sound information output by the plurality of terminals; and
  the predetermined condition comprises that information sent by a sound output by the one or more representative terminals and information sent by a sound output by the one or more general terminals are identical to each other.

13. The control device according to claim 8, wherein
the items of positional information include sound information comprising sound output by the plurality of terminals; and
the predetermined condition comprises that sound data output by the one or more representative terminals and sound data output by the one or more general terminals are identical to each other.

14. The control device according to claim 8, wherein
positional information acquired from the one or more representative terminals includes sound volume information output from the one or more general terminals and collected by the one or more representative terminals; and
the predetermined condition comprises that the sound volume information is equal to or higher than a predetermined threshold value.

15. The control device according to claim 8, wherein
the items of positional information are acquired from a terminal other than the control device among the plurality of terminals through communication.

16. The control device according to claim 8, wherein
the determining divides the plurality of terminals into a plurality of groups on a basis of the distribution of the positions;
the plurality of groups include a first group and a second group;
the one or more representative terminals include a first representative terminal and a second representative terminal;
the one or more general terminals include a first general terminal and a second general terminal;
the first representative terminal and the first general terminal belong to the first group;
the second representative terminal and the second general terminal belong to the second group; and
the determining determines the first representative terminal so that a distance between the first representative terminal and the second representative terminal is longer than a distance between the first representative terminal and the second general terminal.

* * * * *